(12) United States Patent
Cinnamon et al.

(10) Patent No.: US 8,938,919 B2
(45) Date of Patent: Jan. 27, 2015

(54) ELECTRICAL CONNECTORS FOR SOLAR MODULES

(75) Inventors: Barry Cinnamon, Saratoga, CA (US); David Baker, San Jose, CA (US); Wilson W. Leong, San Carlos, CA (US); Alexander W. Au, Campbell, CA (US)

(73) Assignee: Andalay Solar, Inc., San Jose, CA (US)

( * ) Notice: Subject to any disclaimer, the term of this patent is extended or adjusted under 35 U.S.C. 154(b) by 630 days.

(21) Appl. No.: 12/796,466

(22) Filed: Jun. 8, 2010

(65) Prior Publication Data

US 2011/0220180 A1    Sep. 15, 2011

Related U.S. Application Data

(63) Continuation-in-part of application No. 11/859,724, filed on Sep. 21, 2007, now Pat. No. 8,813,460.

(51) Int. Cl.
*E04D 13/18* (2014.01)
*H01L 31/05* (2014.01)
*F24J 2/52* (2006.01)
*H01L 31/042* (2014.01)
*H01L 31/048* (2014.01)
(Continued)

(52) U.S. Cl.
CPC ............... *H01L 31/05* (2013.01); *F24J 2/5211* (2013.01); *F24J 2/5245* (2013.01); *H01L 31/0422* (2013.01); *H01L 31/0482* (2013.01); *H01L 31/0485* (2013.01); *F24J 2/045* (2013.01); *F24J 2002/4665* (2013.01); *F24J 2002/5281* (2013.01); *Y02B 10/20* (2013.01); *Y02E 10/47* (2013.01); *Y02E 10/50* (2013.01); *Y02B 10/12* (2013.01)

USPC .......................... 52/173.3; 136/244; 136/251

(58) Field of Classification Search
USPC .......... 52/22, 173.3, 200, 251, 586.1, 586.32, 52/582.1, 656.1, 665, 726.2; 136/244, 136/251; 126/704, 623
See application file for complete search history.

(56) References Cited

U.S. PATENT DOCUMENTS 559,924 A    5/1896  Arnold
2,554,915 A  5/1951  Metts
(Continued)

FOREIGN PATENT DOCUMENTS

DE    3111969    10/1982
DE    4444439    4/1995
(Continued)

OTHER PUBLICATIONS 5,819,447, filed Oct. 13, 1998, Yamawaki.
(Continued)

*Primary Examiner* — William Gilbert
(74) *Attorney, Agent, or Firm* — DLA Piper LLP (US)

(57) ABSTRACT

A solar module is disclosed that has one or more integrated electrical connectors. In addition, a solar module electrical connector holder is disclosed that has resilient wing portions and axial portions that mate with a first connector window in a frame of a solar module and allow the position of an electrical connector to be moved one of vertically, horizontally and angularly with respect to the frame. In addition, a solar module frame is disclosed that has a first connector window in one of the side frame members that is capable of accepting an electrical connection so that the electrical connection is integrated into the frame of the solar module.

17 Claims, 39 Drawing Sheets

(51) Int. Cl.
 *F24J 2/04* (2006.01)
 *F24J 2/46* (2006.01)

(56) References Cited

U.S. PATENT DOCUMENTS

| | | | |
|---|---|---|---|
| 3,630,253 A | 12/1971 | Sherman |
| 3,658,596 A | 4/1972 | Osborne |
| 4,012,155 A | 3/1977 | Morris |
| 4,047,516 A | 9/1977 | Bruel et al. |
| 4,109,564 A | 8/1978 | Widerby |
| 4,112,922 A | 9/1978 | Skinner |
| 4,146,785 A | 3/1979 | Neale |
| 4,154,223 A | 5/1979 | Lof |
| 4,155,346 A | 5/1979 | Aresty |
| 4,215,677 A | 8/1980 | Erickson |
| 4,217,825 A | 8/1980 | Bruckner |
| 4,219,011 A | 8/1980 | Knoo |
| 4,271,825 A | 6/1981 | Schwob et al. |
| 4,308,858 A | 1/1982 | Skillman |
| 4,310,182 A | 1/1982 | Vandenbossche |
| 4,312,325 A | 1/1982 | Voges et al. |
| 4,353,356 A | 10/1982 | Vandenbossche |
| 4,371,139 A | 2/1983 | Clark |
| 4,429,872 A | 2/1984 | Capachi |
| 4,505,261 A | 3/1985 | Hunter |
| 4,570,408 A | 2/1986 | Frascaroli et al. |
| 4,691,818 A | 9/1987 | Weber |
| 4,718,185 A | 1/1988 | Conlin |
| 4,766,712 A | 8/1988 | Hale |
| 4,966,631 A | 10/1990 | Matlin |
| 5,046,791 A | 9/1991 | Kooiman |
| 5,127,762 A | 7/1992 | Havlovitz |
| 5,134,827 A | 8/1992 | Hartman |
| 5,143,556 A | 9/1992 | Matlin |
| 5,144,780 A | 9/1992 | Gieling |
| 5,164,019 A | 11/1992 | Sinton |
| 5,164,020 A | 11/1992 | Wagner |
| 5,203,135 A | 4/1993 | Bastian |
| 5,205,694 A | 4/1993 | Nagoshi et al. |
| 5,232,518 A | 8/1993 | Nath |
| 5,316,592 A | 5/1994 | Dinwoodie |
| 5,333,602 A | 8/1994 | Huang |
| 5,338,369 A | 8/1994 | Rawlings |
| 5,497,587 A | 3/1996 | Hirai |
| 5,505,788 A | 4/1996 | Dinwoodie |
| D374,169 S | 10/1996 | Kopish |
| 5,571,338 A | 11/1996 | Kadonome et al. |
| 5,596,981 A | 1/1997 | Soucy |
| 5,628,580 A | 5/1997 | Rinderer |
| D387,655 S | 12/1997 | Kopish |
| 5,706,617 A | 1/1998 | Hirai |
| 5,746,029 A | 5/1998 | Ullman |
| 5,746,839 A | 5/1998 | Dinwoodie |
| 5,787,653 A | 8/1998 | Sakai |
| 5,960,790 A | 10/1999 | Rich |
| 6,061,978 A | 5/2000 | Dinwoodie |
| 6,093,884 A | 7/2000 | Toyomura |
| 6,105,317 A | 8/2000 | Tomiuchi et al. |
| 6,111,189 A | 8/2000 | Garvison |
| 6,148,570 A | 11/2000 | Dinwoodie |
| 6,201,180 B1 | 3/2001 | Meyer |
| 6,207,889 B1 | 3/2001 | Toyomura |
| 6,269,596 B1 | 8/2001 | Ohtsuka |
| 6,274,402 B1 | 8/2001 | Verlindon |
| 6,295,818 B1 | 10/2001 | Ansley |
| 6,313,395 B1 | 11/2001 | Crane |
| 6,337,283 B1 | 1/2002 | Verlindon |
| 6,360,491 B1 | 3/2002 | Ullman |
| 6,370,828 B1 | 4/2002 | Genschorek |
| 6,387,726 B1 | 5/2002 | Verlindon |
| 6,423,568 B1 | 7/2002 | Verlindon |
| 6,465,724 B1* | 10/2002 | Garvison et al. ............. 136/244 |
| 6,495,750 B1 | 12/2002 | Dinwoodie |
| 6,501,013 B1 | 12/2002 | Dinwoodie |
| 6,523,320 B2 | 2/2003 | Stoof |
| 6,534,702 B1 | 3/2003 | Makita |
| 6,534,703 B2 | 3/2003 | Dinwoodie |
| 6,568,873 B1 | 5/2003 | Peterson |
| 6,570,084 B2 | 5/2003 | Dinwoodie |
| 6,586,668 B2 | 7/2003 | Shugar |
| 6,634,077 B2 | 10/2003 | Layfield |
| 6,670,541 B2 | 12/2003 | Nagao |
| 6,672,018 B2 | 1/2004 | Shingleton |
| 6,675,545 B2 | 1/2004 | Chen |
| 6,675,580 B2 | 1/2004 | Ansley |
| 6,676,326 B2 | 1/2004 | Wu |
| 6,722,357 B2 | 4/2004 | Shingleton |
| 6,761,008 B2 | 7/2004 | Chen |
| 6,784,360 B2 | 8/2004 | Nakajima |
| 6,809,251 B2 | 10/2004 | Dinwoodie |
| 6,809,253 B2 | 10/2004 | Dinwoodie |
| 6,935,623 B2 | 8/2005 | Cook |
| D510,315 S | 10/2005 | Shugar |
| D511,576 S | 11/2005 | Shingleton |
| 6,959,517 B2 | 11/2005 | Poddany et al. |
| D516,017 S | 2/2006 | Mascolo |
| 6,993,917 B2 | 2/2006 | Unger |
| D519,444 S | 4/2006 | Mascolo |
| 7,043,884 B2 | 5/2006 | Moreno |
| 7,172,184 B2 | 2/2007 | Pavani et al. |
| 7,297,867 B2 | 11/2007 | Nomura |
| D562,225 S | 2/2008 | Almy et al. |
| 7,328,534 B2 | 2/2008 | Dinwoodie |
| D564,958 S | 3/2008 | Almy et al. |
| 7,339,110 B1 | 3/2008 | Mulligan |
| D565,505 S | 4/2008 | Shugar et al. |
| 7,406,800 B2 | 8/2008 | Cinnamon |
| 7,435,897 B2 | 10/2008 | Russell |
| 7,554,041 B2 | 6/2009 | Ducret |
| 7,592,537 B1 | 9/2009 | West |
| 7,634,875 B2 | 12/2009 | Genschorek |
| 7,740,497 B2 | 6/2010 | Nightingale |
| 7,774,998 B2 | 8/2010 | Aschenbrenner |
| 7,866,098 B2 | 1/2011 | Cinnamon |
| 7,987,641 B2 | 8/2011 | Cinnamon |
| 8,234,824 B2 | 8/2012 | Botkin et al. |
| 2002/0046506 A1 | 4/2002 | Ullman |
| 2002/0078991 A1 | 6/2002 | Nagao et al. |
| 2002/0112435 A1 | 8/2002 | Hartman |
| 2002/0193001 A1* | 12/2002 | Yoshikawa et al. ......... 439/540.1 |
| 2003/0010372 A1 | 1/2003 | Dinwoodie |
| 2003/0015637 A1 | 1/2003 | Liebendorfer |
| 2003/0070368 A1 | 4/2003 | Shingleton |
| 2003/0175071 A1 | 9/2003 | Layfield |
| 2003/0201009 A1 | 10/2003 | Nakajima |
| 2004/0007260 A1 | 1/2004 | Dinwoodie |
| 2004/0063265 A1 | 4/2004 | Noble |
| 2004/0140002 A1 | 7/2004 | Brown et al. |
| 2004/0163338 A1 | 8/2004 | Liebendorfer |
| 2004/0179892 A1 | 9/2004 | Du Preez |
| 2005/0115176 A1 | 6/2005 | Russell |
| 2005/0123373 A1 | 6/2005 | Hufnagl et al. |
| 2005/0257453 A1 | 11/2005 | Cinnamon et al. |
| 2006/0005875 A1 | 1/2006 | Haberlein |
| 2006/0118163 A1 | 6/2006 | Plaisted |
| 2007/0074755 A1 | 4/2007 | Eberspacher et al. |
| 2007/0079865 A1 | 4/2007 | Warfield et al. |
| 2007/0102036 A1 | 5/2007 | Cinnamon |
| 2007/0144575 A1 | 6/2007 | Mascolo |
| 2007/0151594 A1 | 7/2007 | Mascolo |
| 2007/0157963 A1 | 7/2007 | Metten et al. |
| 2008/0029144 A1 | 2/2008 | Brazier |
| 2008/0160819 A1 | 7/2008 | Daily et al. |
| 2009/0025314 A1 | 1/2009 | Komamine |
| 2009/0078299 A1* | 3/2009 | Cinnamon et al. ............ 136/244 |
| 2009/0242014 A1 | 10/2009 | Leary |
| 2010/0018571 A1 | 1/2010 | Placer |
| 2010/0065108 A1 | 3/2010 | West et al. |
| 2011/0099929 A1 | 5/2011 | Liegeois et al. |

FOREIGN PATENT DOCUMENTS

| | | |
|---|---|---|
| DE | 29703481 | 11/1997 |
| DE | 19906464 | 8/2000 |

(56) References Cited

FOREIGN PATENT DOCUMENTS

| | | |
|---|---|---|
| DE | 102005002828 | 8/2006 |
| EP | 1 783 440 | 5/2007 |
| JP | 47-023570 | 7/1971 |
| JP | 47-057885 | 5/1972 |
| JP | 57-087561 | 1/1982 |
| JP | 57-077856 | 5/1982 |
| JP | 58-133945 | 9/1983 |
| JP | 59-191748 | 12/1984 |
| JP | 61-040963 | 11/1986 |
| JP | 02-42449 | 3/1990 |
| JP | 04-052367 | 2/1992 |
| JP | 04-194485 | 4/1992 |
| JP | 06-069527 | 3/1994 |
| JP | 06-41156 | 5/1994 |
| JP | 07-202242 | 8/1995 |
| JP | 08-296311 | 11/1996 |
| JP | 10-019175 | 1/1998 |
| JP | 10-176403 | 6/1998 |
| JP | 10-266499 | 10/1998 |
| JP | 10-317619 | 12/1998 |
| JP | 10-317621 | 12/1998 |
| JP | 10-317622 | 12/1998 |
| JP | 11-002004 | 1/1999 |
| JP | 11-002011 | 1/1999 |
| JP | 11-006262 | 1/1999 |
| JP | 11-040835 | 2/1999 |
| JP | 11-222991 | 8/1999 |
| JP | 2000-150947 | 5/2000 |
| JP | 2000-345664 | 12/2000 |
| JP | 2001-148493 | 5/2001 |
| JP | 2001-210853 | 8/2001 |
| JP | 2002-141541 | 5/2002 |
| JP | 2002-294957 | 10/2002 |
| JP | 2003-227207 | 8/2003 |
| JP | 2005-268529 | 9/2005 |
| JP | 10-159284 | 6/2008 |
| WO | WO 2005116359 | 12/2005 |
| WO | WO 2007103882 | 9/2007 |

OTHER PUBLICATIONS

PCT International Search Report of PCT/US12/40762; dated Oct. 22, 2012.
PCT Written Opinion of the International Searching Authority of PCT/US12/40762; dated Oct. 22, 2012.
PCT International Search Report and Written Opinion of PCT/US05/16849; dated Jun. 19, 2008.
PCT International Search Report and Written Opinion of PCT/US08/10992; dated Nov. 25, 2008.
PCT International Search Report and Written Opinion of PCT/US09/037021; dated May 12, 2009.
PCT International Search Report and Written Opinion of PCT/US11/039519; dated Dec. 2, 2011.

\* cited by examiner

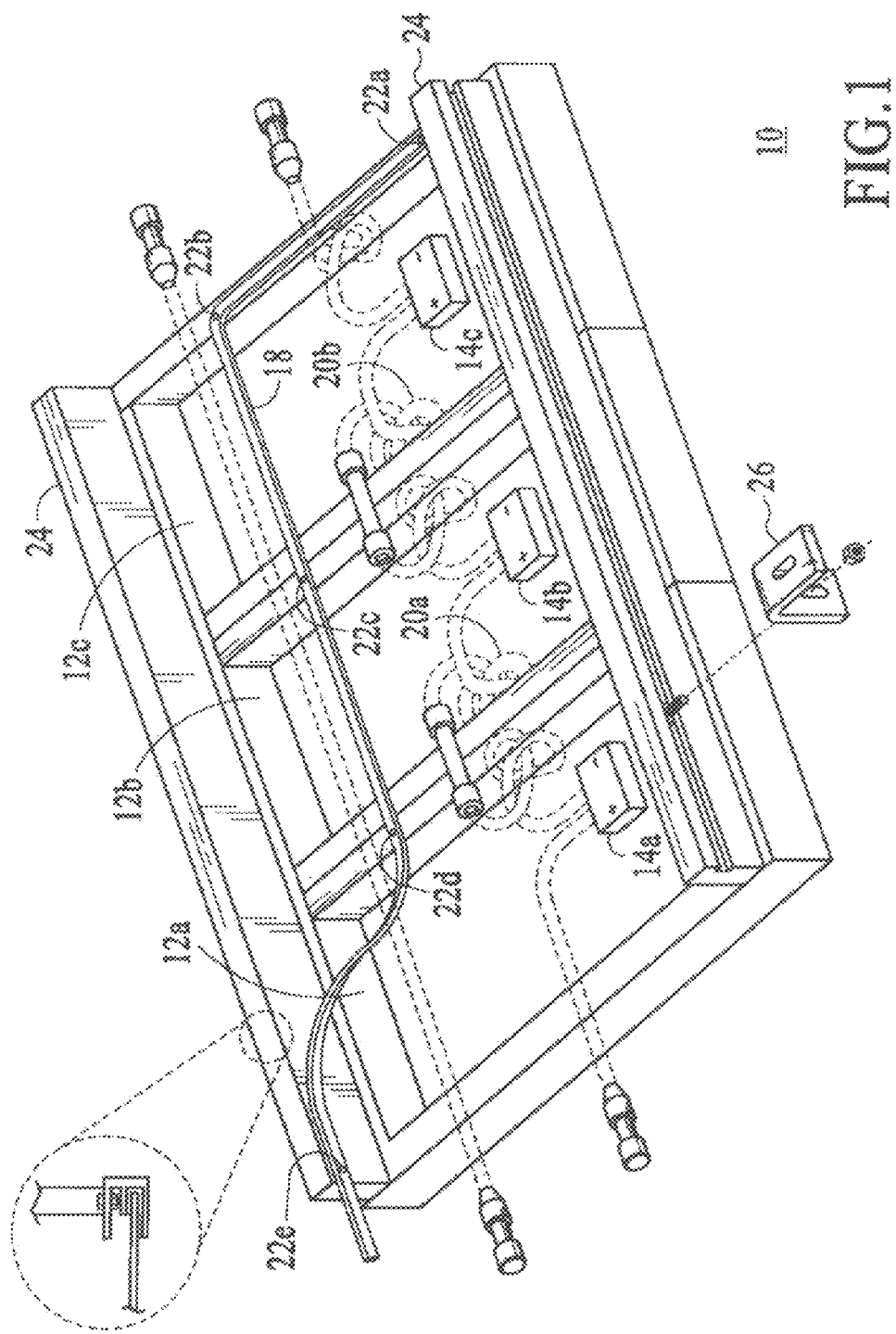

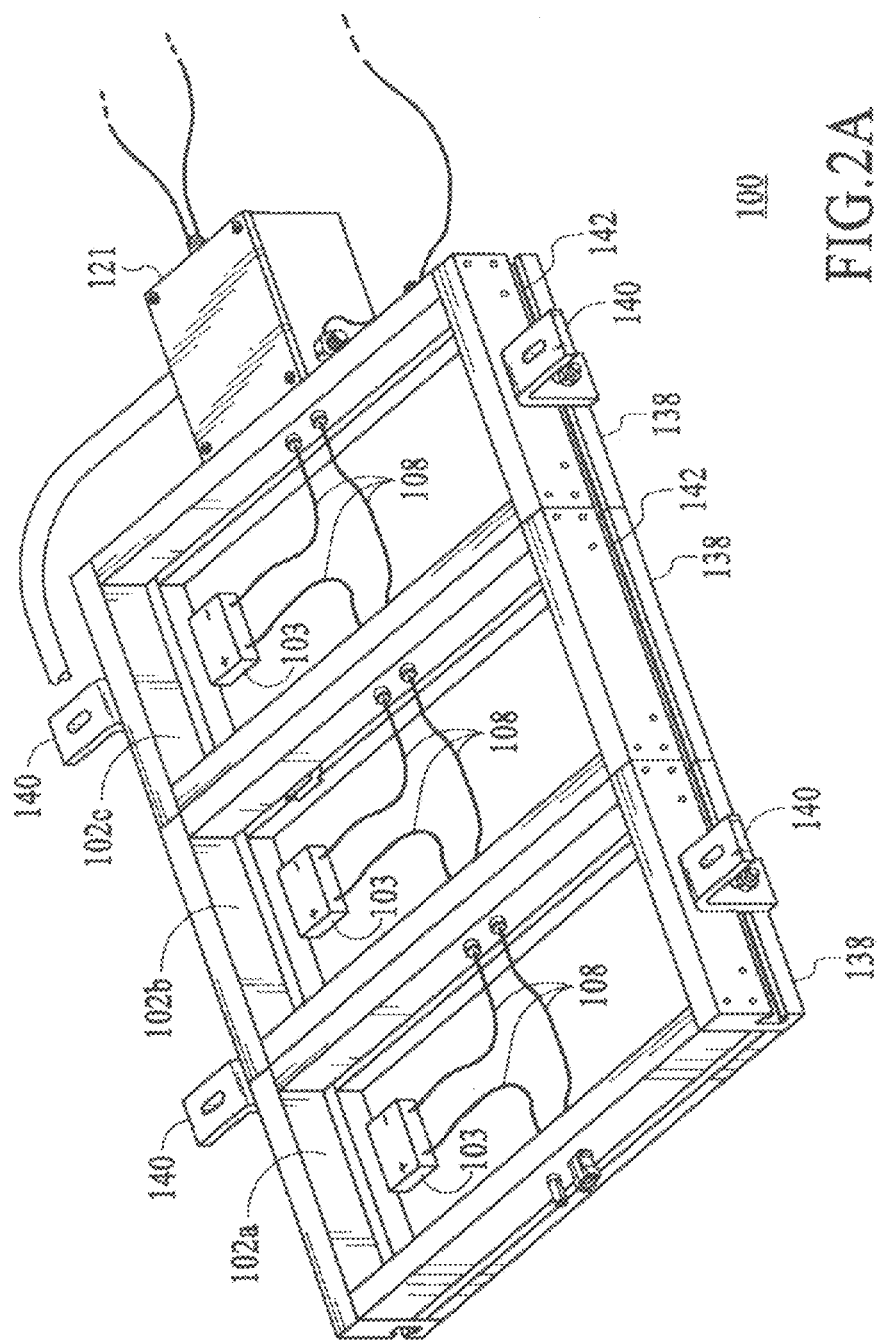

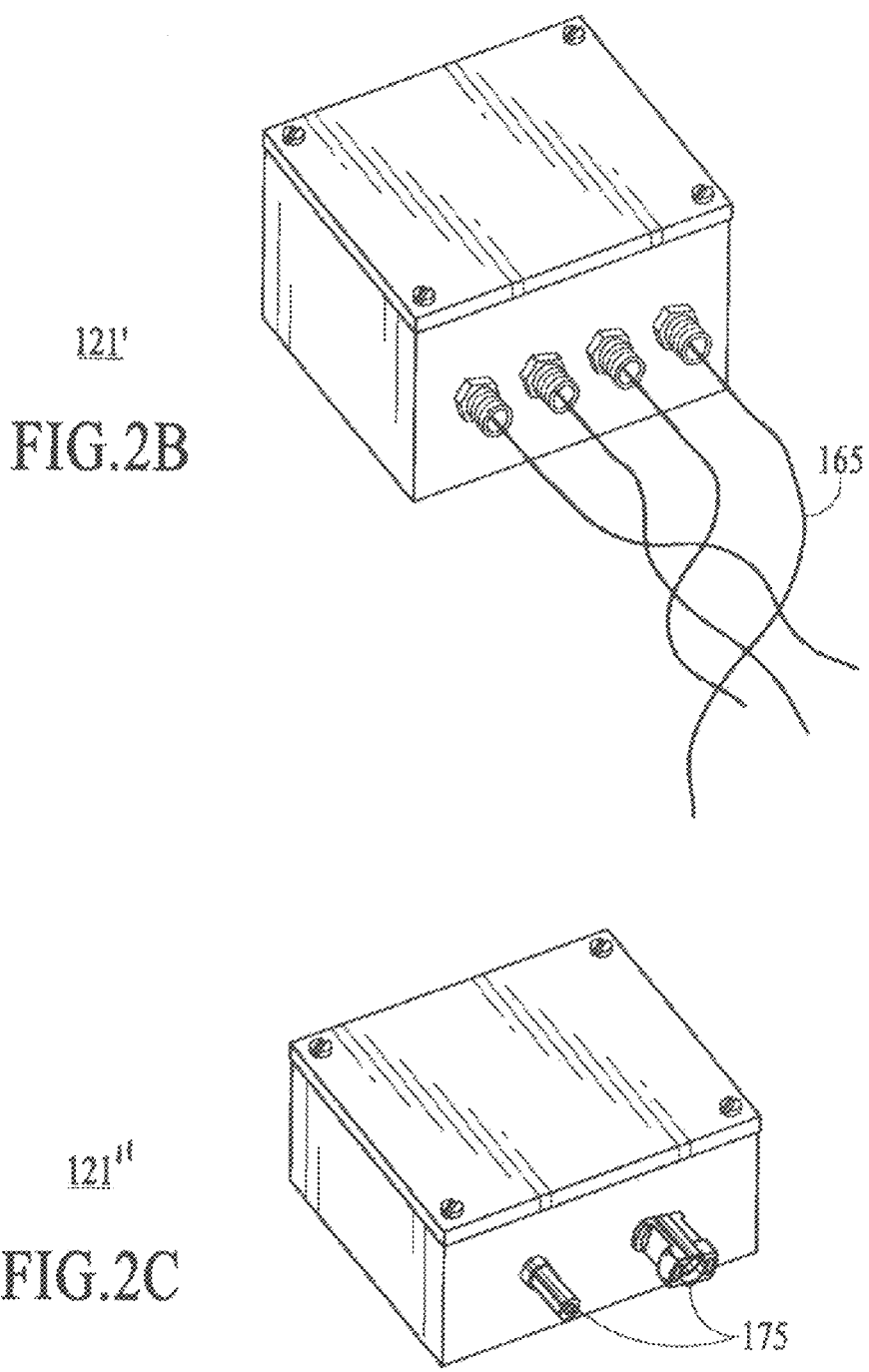

500

600

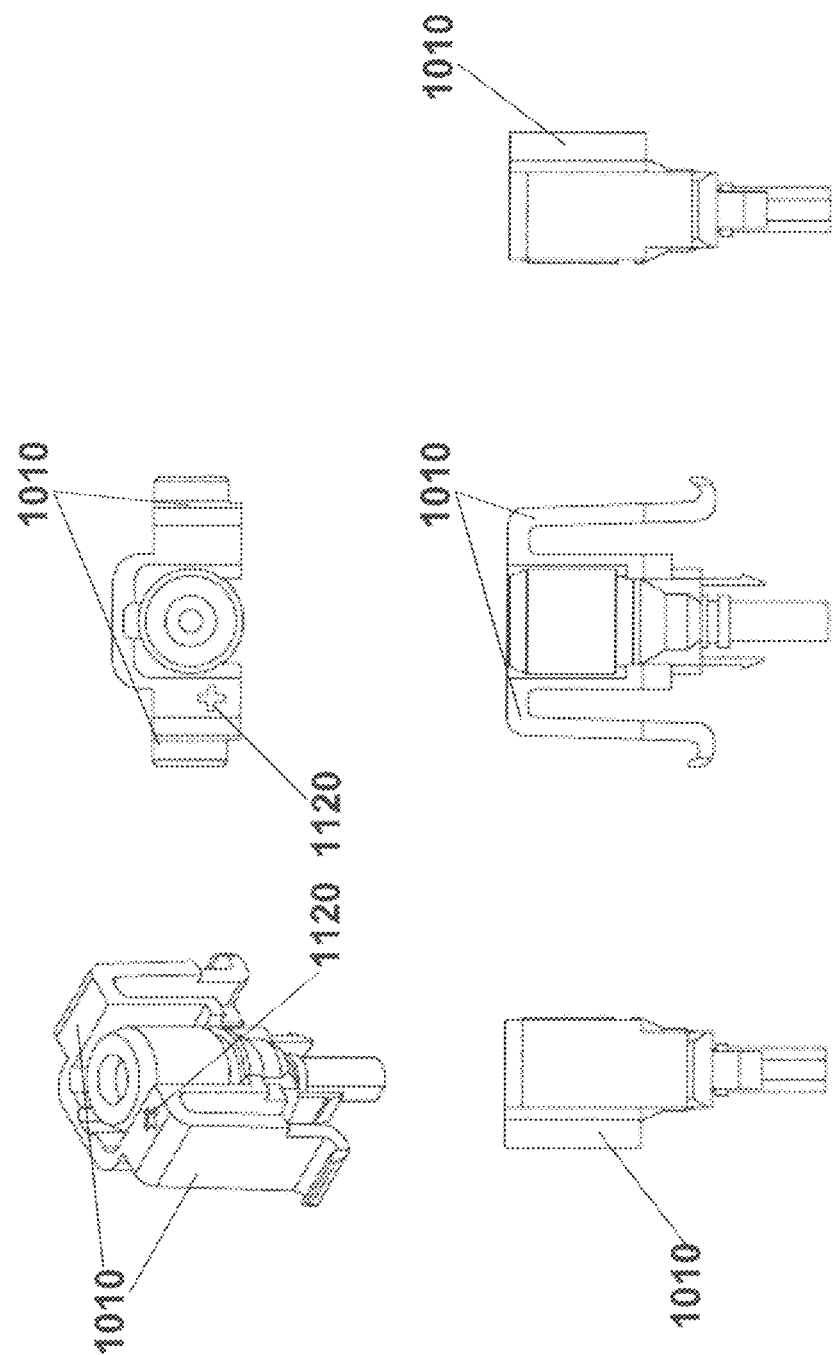
FIGURES 18C1 – 18C5

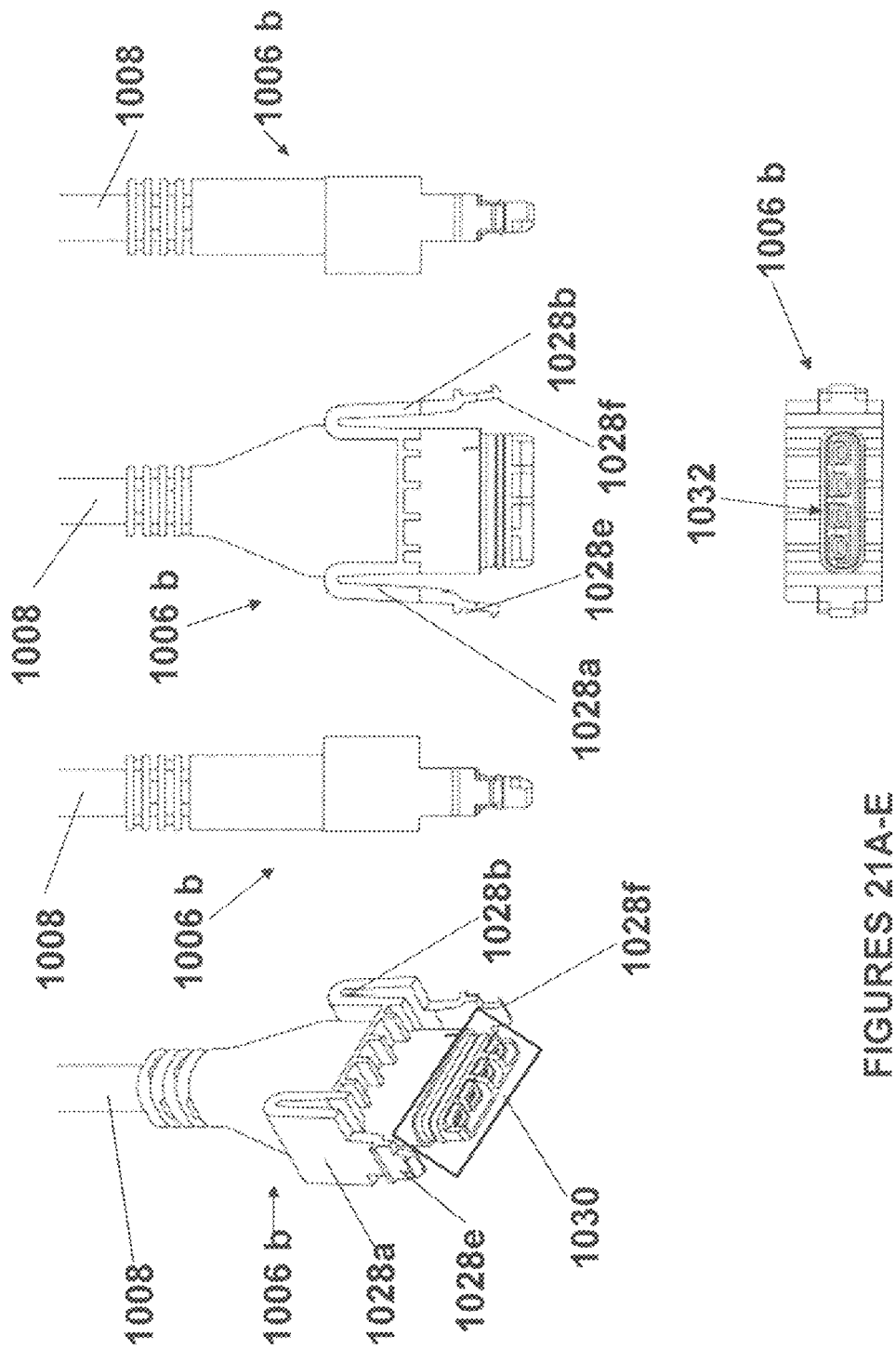
FIGURES 21A-E

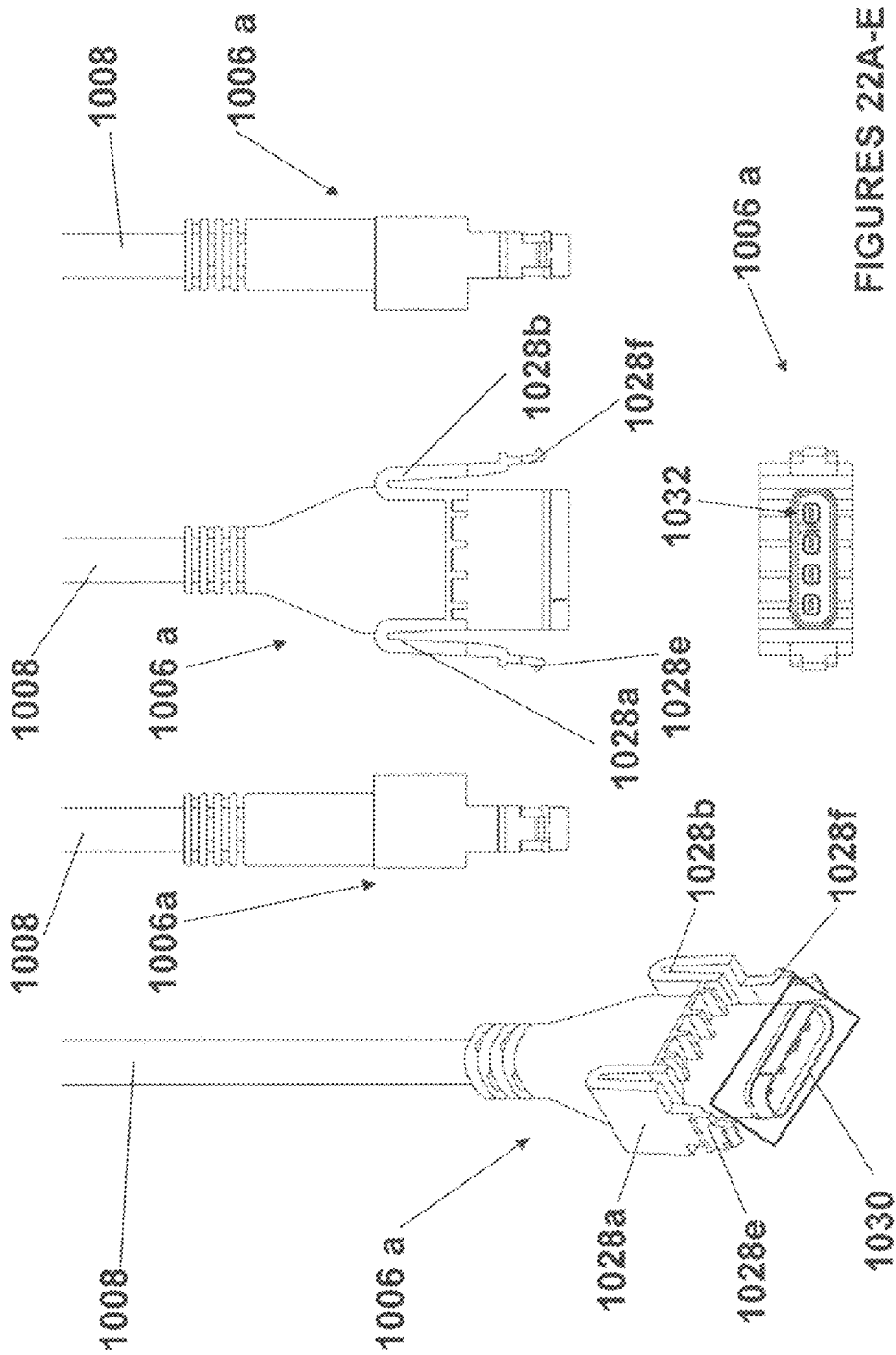
FIGURES 22A-E

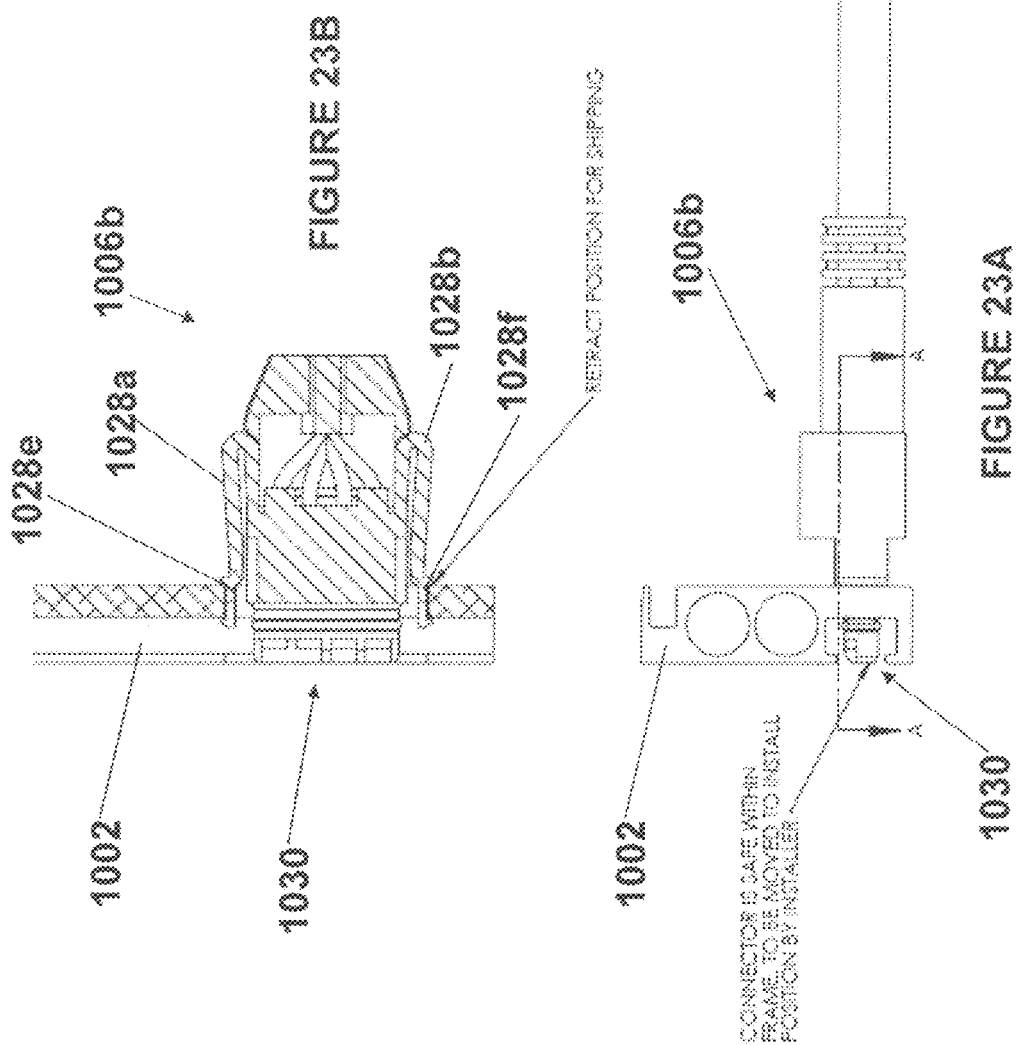

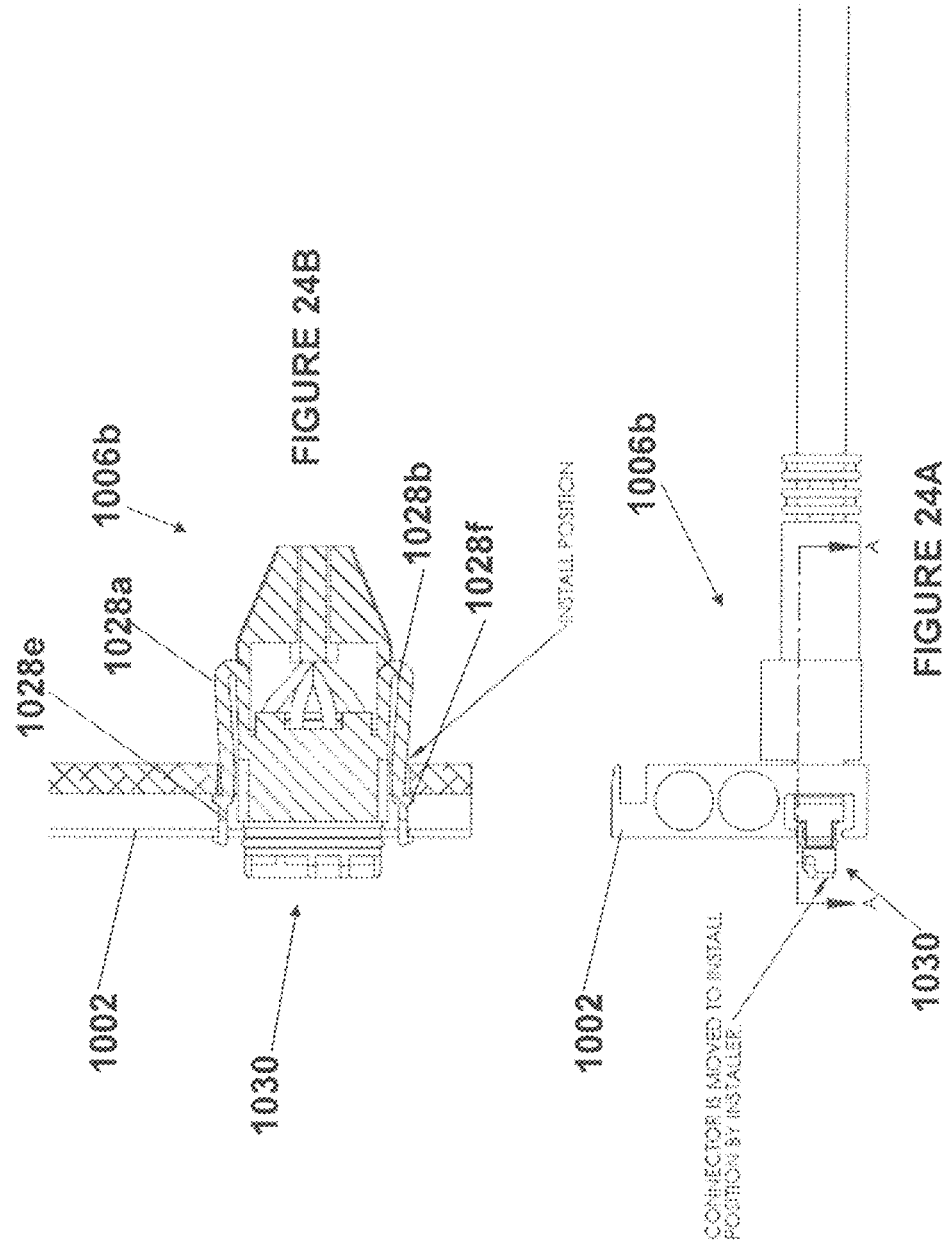

ELECTRICAL CONNECTORS FOR SOLAR MODULES

PRIORITY CLAIM

This application in a continuation in part of and claims priority under 35 USC 120 to U.S. patent application Ser. No. 11/859,724 filed on Sep. 21, 2007 now U.S. Pat. No. 8,813, 460 and entitled "Mounting System for Solar Panels" which is incorporated herein by reference.

FIELD

The system and method relate generally to solar panels and more particularly to electrical connectors used during the assembly and mounting of a solar panel.

BACKGROUND

Solar electric systems are the most environmentally friendly way of generating electricity. To provide such solar electric systems, typically there is a solar panel, which comprises a plurality of solar modules, which are coupled together. The solar panels are typically assembled directly on the roof of a building, assembled on the ground and then mounted on a roof of a building, or installed on a dedicated ground or pole mounted frame. FIG. 1 illustrates a conventional solar panel assembly 10. The solar panel in this embodiment comprises three solar modules, 12A-12C. However, one of ordinary skill in the art recognizes there could be any number of modules and they could be in any configuration to form a solar panel.

Each of the solar panel modules 12A-12C includes a junction box 14A-14C which receives cables 16, which are applied in serial fashion from one module to the next. Also included within each of these modules 12A-12C is an electrical ground wire assembly 18, which is used to ground the modules and the underlying frame at the appropriate points. In addition, each of the modules includes extra wiring from nearby modules that must be wrapped and tied down in between, as shown at 20A and 20B to ensure that the wires do not get damaged. FIG. 1A is a view of the grounding screw for the solar panel. The screw or bolt assembly 22, which must be provided in several places, attaches the ground wire assembly 18 to each piece of equipment in the assembly at least once, in this case five (5) places, on each of the solar modules 12A-12C and underlying frame, thereby creating a grounded assembly.

Referring back in FIG. 1, there are two metal rails 24 that extend in parallel with and along the length of the solar modules 12A-12C. These rails form the underlying support structure for the solar modules. The rails are attached to the roof so that the entire solar panel can be mounted in a single rigid geometric plane on the roof, thereby improving the durability and aesthetics of the installation. In some cases the rails are mounted to the roof first (attached to the roof with L shaped brackets and lag bolts to the underlying rafters), and then the modules are attached to the rails with bolt-fastened clips, In other cases, as shown in FIG. 1B, the rails are attached to the modules first (in this case with hex nuts and bolts or in other cases clips), and then the entire module-rail assembly (or panel) is attached to the roof with L shaped brackets 26 (FIG. 1) and lag bolts to the underlying rafters. These rails 24 are also electrically grounded as indicated above.

For ventilation and drainage purposes it is beneficial to mount the panel above the roof with a small air gap between the roof surface and underside of the modules and rails. For wiring and grounding purposes for roof-assembled panels it is beneficial to have access below the modules so that wires can be connected and tied. For single geometric plan purposes it is beneficial to provide some vertical adjustability of the mounting point to account for variability (waviness) in roof surfaces. For these reasons the roof mounting bracket (whether it is an L shaped bracket or different design) generally provides some vertical adjustability (typically 1-3 inches). Moreover, roof attachments must be made to a secure underlying surface, generally a rafter. These rafters may not be consistently spaced. Therefore, the mounting rails typically include some kind of adjustable groove so that the mounting point from the rail to the roof attachment (L bracket) can be directly over a secure mounting point—wherever this point may be.

The conventional solar panel 10 requires many individual operations to construct and mount in order to provide a reliable and high performance solar electric system. Mounting on uneven roof surfaces requires many small parts and adjustments. Making sure there is airflow and drainage requires the panel to be raised off the roof slightly, but aesthetic considerations require the pane] to be close to the roof. Each module in the panel must be wired together, extra wiring must be tucked away securely, and every conductive component must be electrically grounded. All the required parts and steps increase the cost of the system, which ultimately negatively affects the payback of the system. In addition, conventional solar modules are shipped in cardboard boxes on palettes, requiring additional shipping costs and substantial unpacking and cardboard disposal costs.

Accordingly, what is desired is a solar module which has more secure electrical connectors that are integrated into a frame of the solar modules and ensure proper connection. It is also desirable to provide electrical connectors for solar modules that reduce installation time and reduce electrical hookup time. The system and method disclosed below provides these desirable aspects.

BRIEF DESCRIPTION OF THE DRAWINGS

FIG. 1 illustrates a conventional solar panel assembly;
FIG. 2A is a diagram of a back view of the solar panel shown in FIG. 2;
FIGS. 2B and 2C are first and second embodiments of connector boxes.

FIGS. 18C1-18C5 are a perspective view, top view, right view, front view and front view, respectively, of the electrical connector shown in FIGS. 18A and 18B;

FIG. 21A-E are a perspective view, a right view, a front view, a left view and a end view, respectively, of another embodiment of a female electrical connector;

FIGS. 22A-E are a perspective view, a right view, a front view, a left view and a end view, respectively, of another embodiment of a male electrical connector that can be used with the female connector of FIGS. 21A-21E;

FIGS. 23A and 23B are a side view and a sectional view along line A-A, respectively, of the female connector of FIGS. 21A-E in a retracted position; and FIGS. 24A and 24B are a side view and a sectional view along line A-A, respectively, of the female connector of FIGS. 21A-E in an install position.

DETAILED DESCRIPTION OF ONE OR MORE EMBODIMENTS

The system and method are particularly applicable to an embodiment of a solar module electrical connector that has the features described below and it is in this context that the system and method are described. It will be appreciated, however, that the system and method has greater utility since the system covers solar module electrical connector made with different materials or with different features that are within the scope of the system and method.

Figure 2:
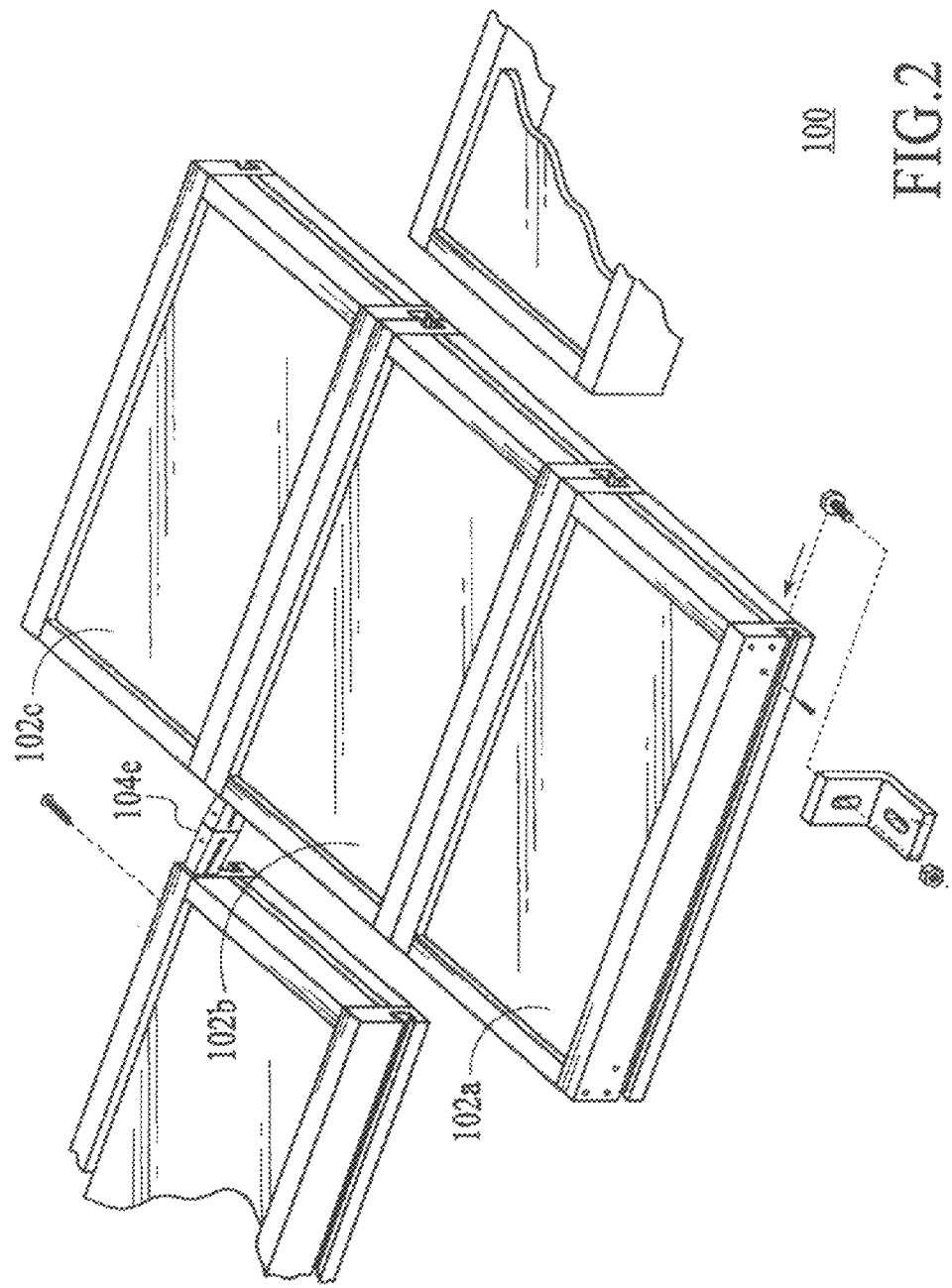
FIG. 2 illustrates a perspective view of a mounting system for a solar panel.

FIG. 2 illustrates a perspective view of a mounting system for a solar panel 100. As is seen, there are three modules 102A-102C shown that are coupled together that include several features that allow for a modularized and integrated system for the solar panel 100. Firstly, there is a splice that mechanically connects one module to another and provides the electrical grounding connection between the solar modules. The mechanical strength of the splice and attachment technique to the module frame allows each module frame to function in the same rigid way as the underlying frame rail in a conventional solar panel assembly. In addition, there are cable connector grooves between modules that minimize the amount of wiring activities that are required for connecting the modules together. Finally, the system includes only requiring one electrical grounding connection to the entire panel; module to module and module to rail grounding connections are not needed. In addition the mounting system provides many elements that significantly ease the assembly of the solar panels as well as allowing for the efficient packing of the solar modules prior to installation. To describe the features of the system in more detail refer now to the following description in conjunction with the accompanying figures.

FIG. 2A is a diagram of a back view of the solar panel 100. As has been above-mentioned the solar panel 100 includes a plurality of modules 102A-102C. However, one of ordinary skill in the art readily recognizes that the panel 100 could include any number of modules in both the X and Y directions and could be in any configuration and its use would be within the spirit and scope of the system. As is seen each module 102 includes a junction box 103. Each junction box 103 is coupled to wiring segments 1.08 which includes a connector mount. Wiring segments 108 are utilized to electrically connect the modules 102 together and also to connect the modules 1.02 to a combiner junction box 121. Accordingly, the combiner junction box 121 provides a connection for high voltage wiring and a grounding path. The combiner junction box 121 provides for wiring transitions which are done either manually or automatically. The combiner junction box 121 is utilized to electrically couple a plurality of solar panels. An set of electrical connectors 1000 that are integrated into a frame member 1002 (such as an end frame member) are also shown and will be described in more detail below with reference to FIGS. 18-20.

FIG. 2B is a first embodiment of a conventional combiner junction box 121'. As is seen, the conventional junction box 121' would have to be adapted to the solar module based upon the wiring 165. This would add considerable time and cost when installing the box 121'.

Figure 2D:
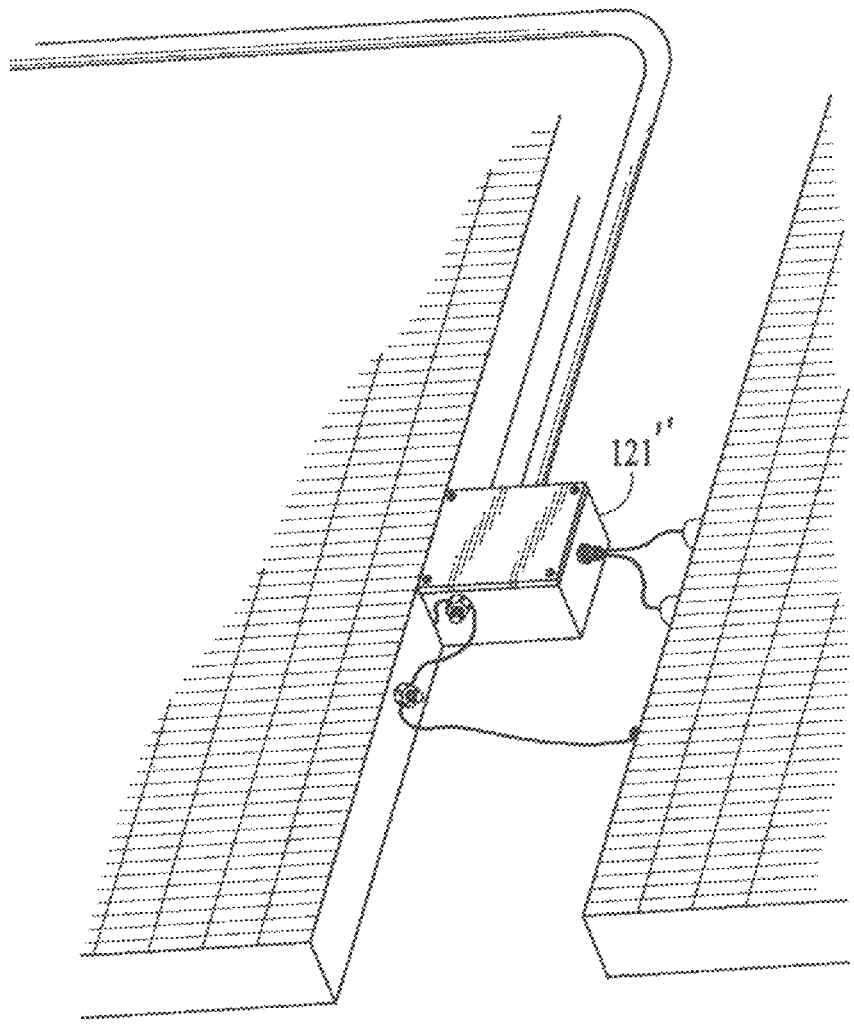
FIG. 2D is an embodiment of a main connector block coupled between two solar panels.

A custom combiner junction box 121" is shown in FIG. 2C. The custom combiner junction box 121" has several advantages over the conventional combiner junction box 121. Referring back to FIG. 2A, firstly, as is seen the connections for wiring segments 108 can be coupled directly into the connections 175 of the junction box 103'. FIG. 2D illustrates the combiner junction box 121" coupled between two solar panels. Furthermore the custom combiner junction box 121" is directly coupled to the outside of the solar panel and permanently fastens to the side of the panel with a bolt, The bolt also provides a grounding path to a system ground conductor.

Figure 1A:
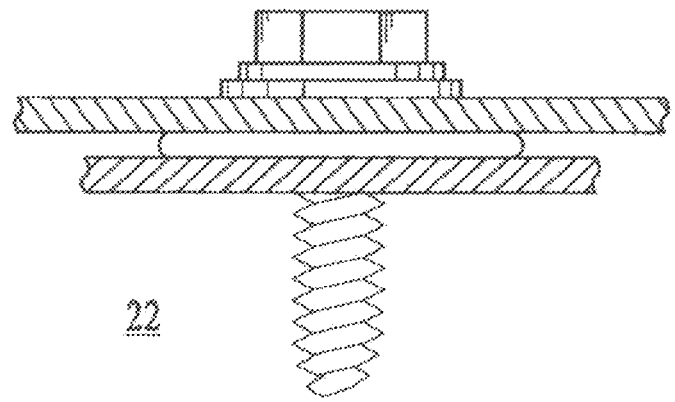
FIG. 1A is a view of a grounding screw for the solar panel.
Figure 1B:
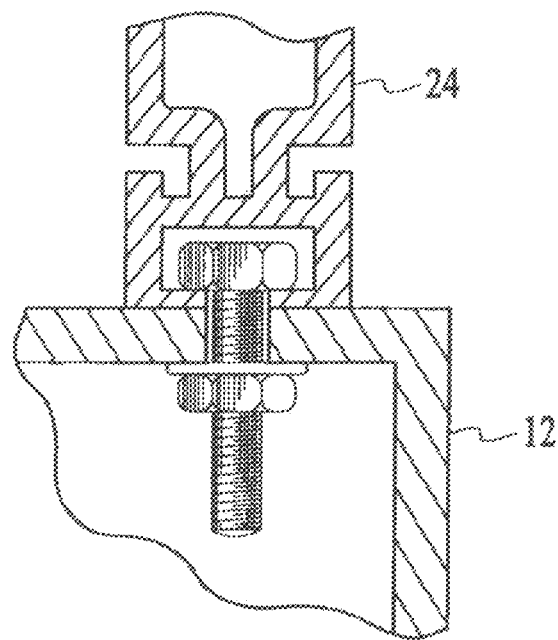
FIG. 1B is a view of a module attached to a rail.

Accordingly, the solar panel 100 requires significantly fewer parts to assemble and is more easily constructed than the conventional solar panel 10 of FIG. 1.

Optimally a cable holder 136 can also be used in this solar panel. Referring back to FIG. 2A, a cable holder 136 is coupled to a side portion of a module to hold cables that may be stored in the panel. Typically the cable holder 136 is a cable clip that holds the stored cable in place. Also, the cable holder 136 can be molded into the cable itself.

Figure 2E:
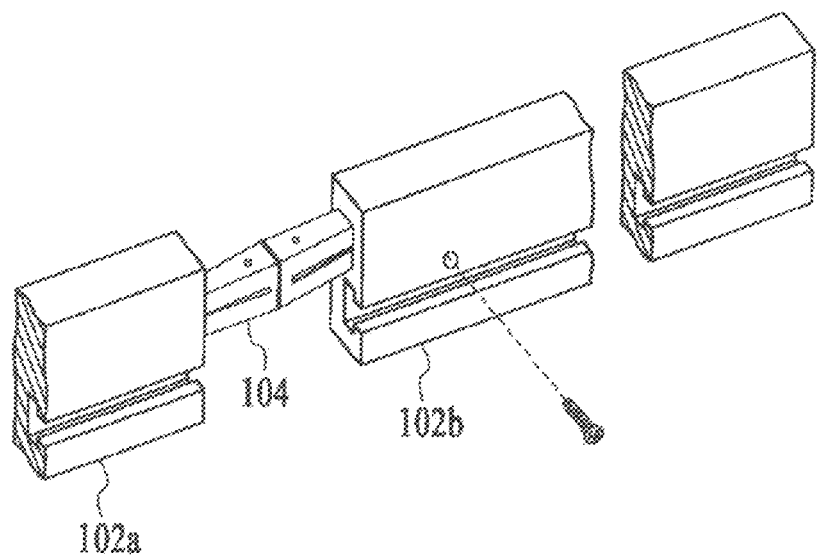
FIG. 2E shows an east-west splice that allows connection of a module or panel to the side (typically east or west) of an existing module.

Referring now to FIG. 2E, as is seen there is an east-west (e-w) splice 104 shown internal to two modules 102A and 102B that connect the modules 102A and 102B. The splice 104 provides several useful features for the panel 100, including mechanical rigidity between molecules, a grounding path between modules, an alignment method between modules, and a securing method between modules.

Figure 2F:
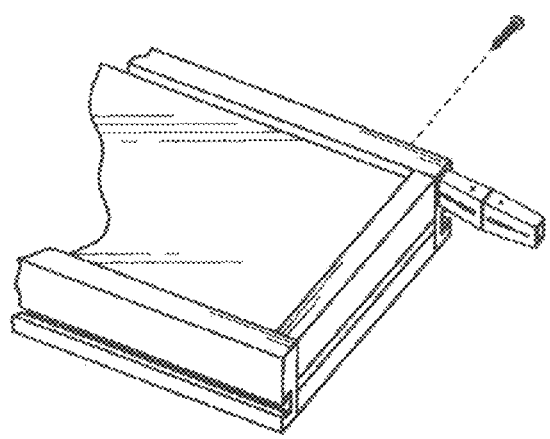
FIG. 2F shows a north-south splice that allows connection of a module or panel above or below (typically north or south) of an existing module.

Also north-south splices between rows can be effectively utilized. FIG. 2F shows a north-south splice 104 that allows connector of a module or panel above (typically north) or below an existing module. This splice 104E provides alignment between rows, rigidity between rows and provides a grounding connection. Use of this north-south splice 104E reduces mounting points on the mounting surface.

In one embodiment, the splice is a removable connecting piece that is in a module. Additionally, the splice is generally hidden when installed, by virtue of mounting inside the module frame hollow section or side groove. The splice allows for a very close fit between modules, thereby improving space utilization. Also, the splice has conductive capability (including the non-conductive main part with conductive wires or surface). It should also be understood, that although the splice in this embodiment is internal to the solar modules, one of ordinary skill in the art readily recognizes that the splice could be external and its use could be within the spirit and scope of the system. The following will describe different embodiments of a splice.

Figure 3A:
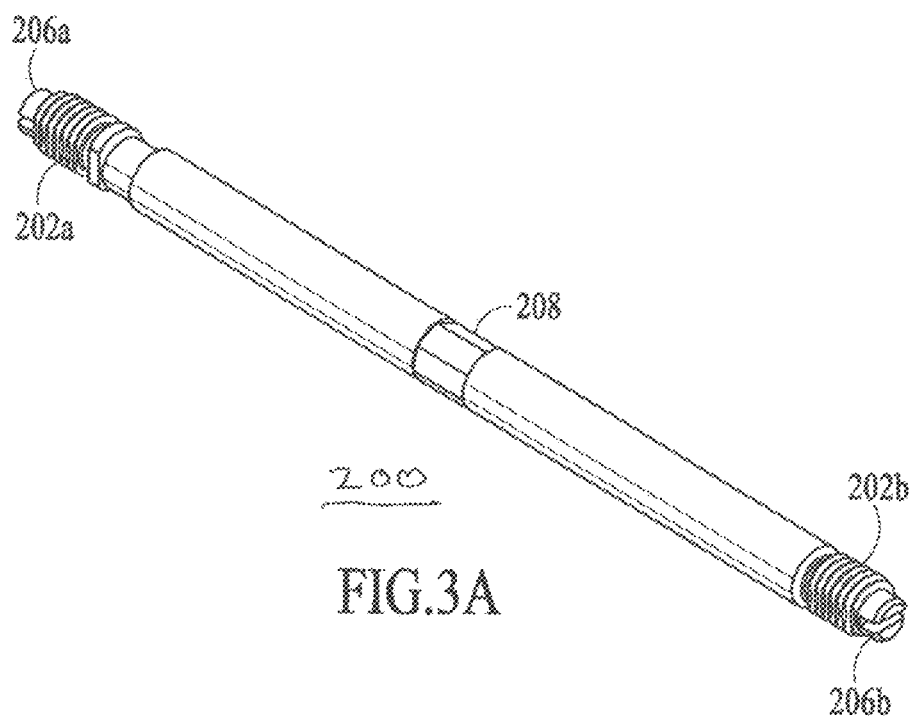
FIG. 3A is an embodiment of a threaded splice.

FIG. 3A is a first embodiment of a threaded splice 200, The splice 200 as is seen include first and second threads 202a and 202b at opposite ends thereof. This splice drives modules together, provides structural rigidity and provides grounding between modules. Through the use of the opposing threads 202a, 202b a single motion can be utilized to drive modules together and apart. The splice 200 utilizes a driver to tighten and untighten the splice between modules. In this embodiment a screw driver head is utilized on the end portions 206a and 206b of the threads 202a and 202b. Other driver heads could be utilized such as Phillips, etc. and that use would be within the spirit and scope of the system. Furthermore there is a cam lock 208 which locks the splice in place when properly positioned within the solar panel. An implementation of such a driver will described in detail later in the specification.

Figure 3B:
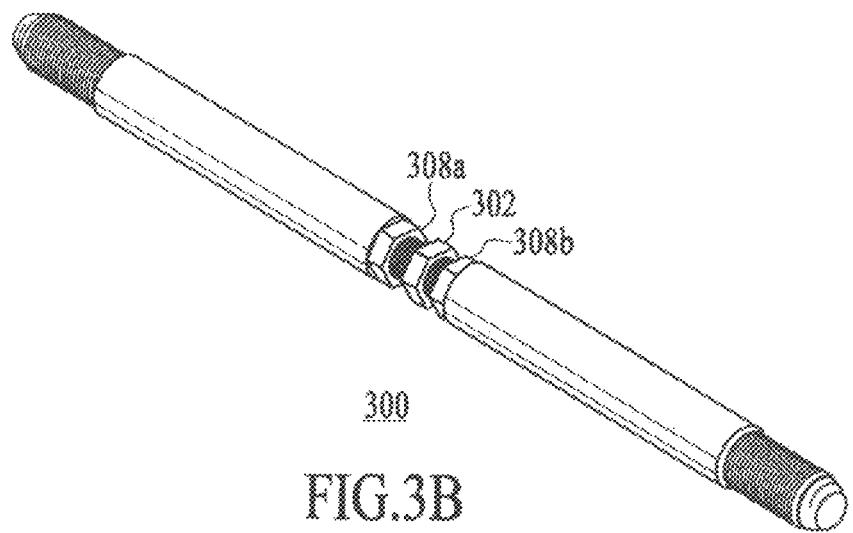
FIG. 3B illustrates an embodiment of a threaded splice with a double screw lock.
Figure 3C:
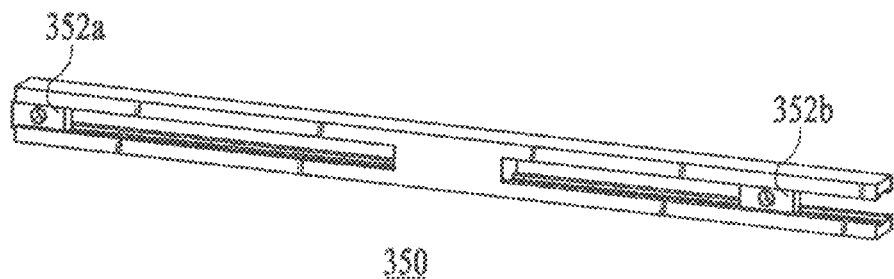
FIG. 3C illustrates an embodiment of a slide cam lock for a splice.

FIG. 3B illustrates a second embodiment of a threaded splice 300 that includes double screw lock 302. In this embodiment, a screw lock 302 drives the solar modules together. The screw lock 302 provides structural rigidity and also provides electrical grounding between modules. In this embodiment, the left and right hand thread 308a, 308b allow for a variety of distances between modules. The spacing between modules is dictated by the center left and right hand thread 308a and 308b. The splice 300 is coupled to the solar module using a custom wrench. The use of such wrench will be described in detail hereinafter, FIG. 3C illustrates an embodiment of a slide cam lock for a splice. The slide cam lock 350 ensures alignment of modules through extrusion using the locking mechanism 352a and 352b. The blocks move into position to secure the splice.

Figure 3D:
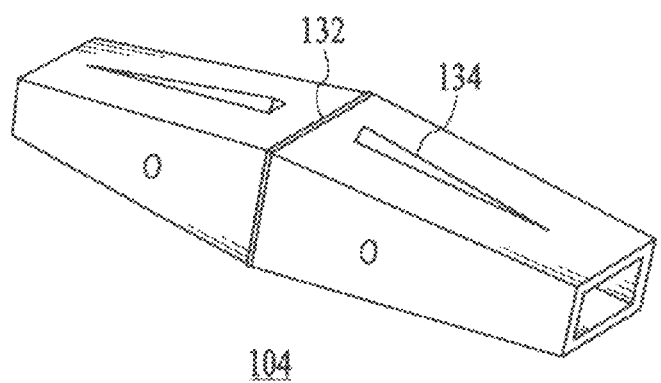
FIG. 3D illustrates a third embodiment of a splice.

FIG. 3D illustrates a third embodiment of a splice 104. The splice 104 is tapered to allow for easy initial assembly line up and a final tight fit between the modules 102A and 102B. In a preferred embodiment it is precisely located in the panel 100 in a centerline fashion. In a preferred embodiment the splice 104 is a tapered conductive metal to provide a grounding path between modules, and includes a sharp edge to improve grounding to each module. The splice 104 is also grooved for easy screw insertion from the top or the side of the module 102. The splice 104 precisely aligns the modules 102 and allows the assembler to compress the connector sockets 108, thereby completing an electrical connection between the two adjacent modules. The electrical connection between the two adjacent modules by the splice 304 eliminates the need to run a grounding wire between each module. As is seen only one other grounding wire is required for an entire panel assembly as long as all solar modules are connected with a splice. The splice provides sufficient rigidity between modules so that the entire panel can be transported and lifted to a roof, or installed directly on a roof or other surface in a secure and long lasting fashion.

In an embodiment, each splice would utilize a screw for attachment to secure the two modules together. Other mechanisms for securing the two modules together include but are not limited to a cam type compression device, a press fit or toothed barb device, a spring clip attachment, a through pin and an expandable section at each end. For a three module solar panel, as illustrated in exploded view, a total of four splices and eight self-threading screws are utilized to provide the solar panel. Accordingly, a minimal number of parts are required for the assembly of the panel. The splice also includes a plurality of raised features, which couple the modules together. The first raised feature 132 acts as a stop for the splice. The second raised feature 134 acts as a grounding path for the splice.

Referring back to FIG. 2A, a plurality of connector mounts 108 are provided in each of the modules 102. These connector mounts 108 provide the following advantages:

The connector mounts 108 can be labeled (+/−) and then sized to only accept the proper cable connection, thereby minimizing wiring problems. The connector mounts 108 are located on the modules (on the left/right or E-W sides, and/or on the top/bottom or N/S sides) to prevent improper wiring based on cable lengths and connector socket size/configuration. The connector mounts 108 are on frame sides to allow for easy and reliable module interconnection. The connector mounts 108 on frame sides allow for pre-installed home run return wire paths. The connector mounts 108 on frame sides allow for interconnection of strings. The connector mounts 108 on frame sides allow for concealed wire connections after modules are mounted. Finally, the overall design improves wire management and grounding.

Figure 3E:
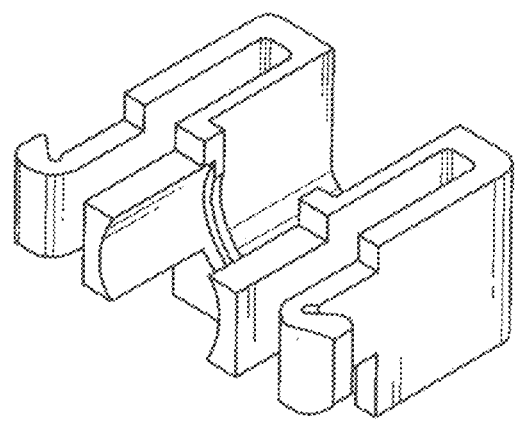
FIG. 3E illustrates an embodiment of a connector mount.
Figure 3F:
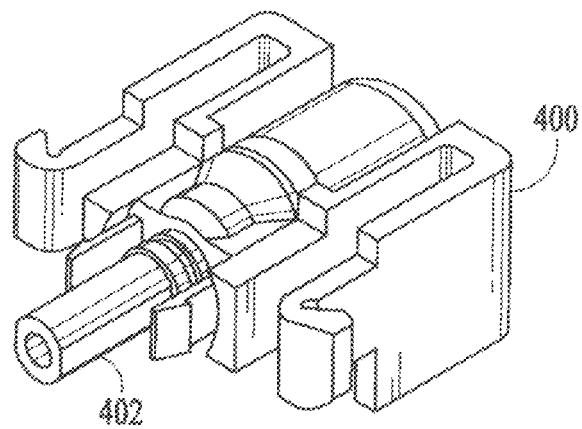
FIG. 3F illustrates the connector mount holding a male connector.
Figure 3G:
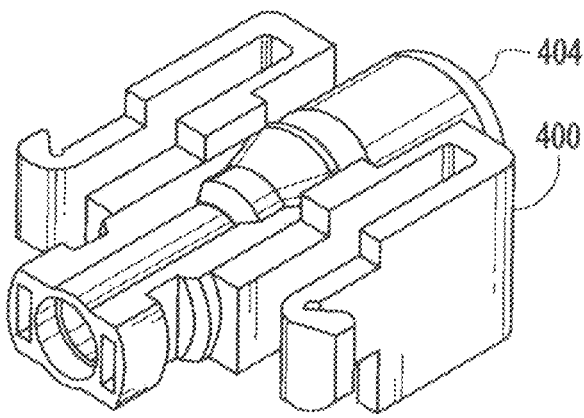
FIG. 3G illustrates the connector mount holding a female connector.

FIG. 3E illustrates an embodiment of a connector mount 400. The connector mount 400 could be utilized with either a male connector 402 or female connector shown in FIGS. 3F and 3G respectfully for securing the electrical contacts. The connector mount 400 retains and engages the electrical contact when the solar panel is driven by a splice to close the electrical circuit. The junction mount 400 can also be molded onto the connector itself, The connector mount 400 also retains the electrical contacts when modules are separated to open the electrical circuit. The connector mount 400 is either factory installable or field installable. Also the connector mount 400 can be molded into connector itself.

Figure 4A:
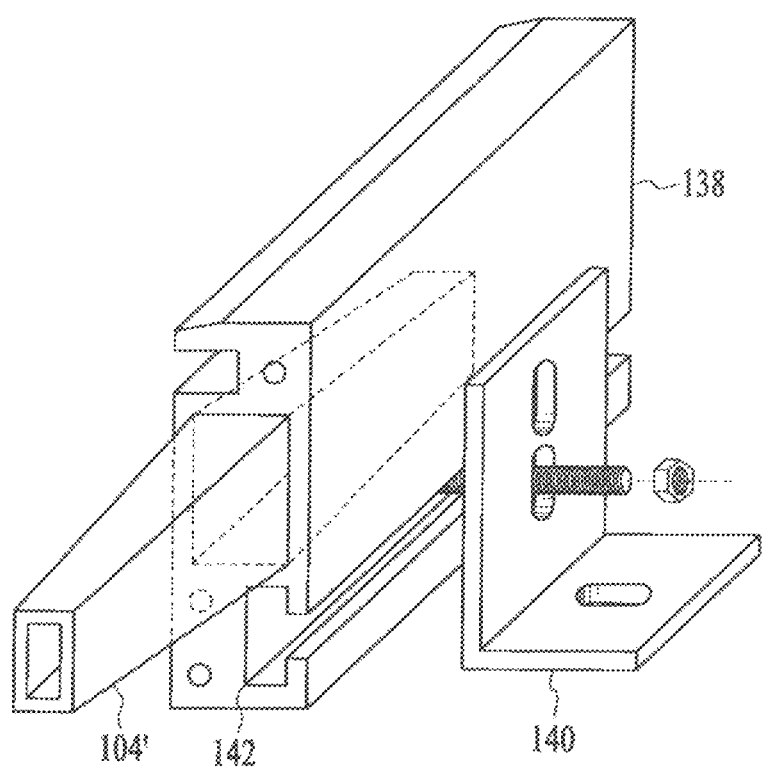
FIG. 4A illustrates a groove on the module panel and a surface mounting bracket for securing the module panel to the roof.

FIG. 4A illustrates a groove 142 on the metal plate 138 of the module. The groove allows for securing the panel (composed of one or more modules) to a structure, such as a roof, with the mounting bracket. The grooves 142 on the sides of each of the metal plate are aligned when the modules are connected with splices, thereby creating a continuous groove along the entire panel to allow for the connection of the solar panel to a roof or the like. In so doing the solar panel can be rigidly mounted on a structure in a single plane. The continuous groove allows attachment to an available secure point (typically a rafter) at any horizontal location. Typically the grooved portion will comprise an extrusion on a metal plate 138 shown in FIG. 4 that is part of the module thereby creating a full and roughly continuous extension in the panel. This groove 142 can be installed on both the sides (east-west) and top/bottom (north-south) of the modules, allowing the module to be installed in a variety of different orientations.

Figure 4B:
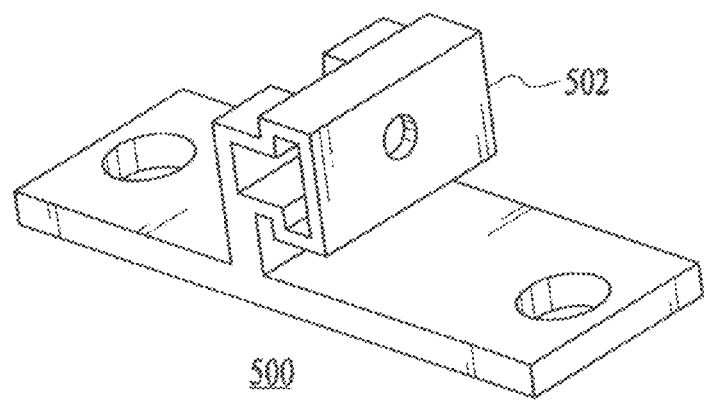
FIG. 4B illustrates a first embodiment of a ground mount.

A bracket 140 attaches securely to the roof and then attaches to the grooved metal plate 138 with a bolt. This bracket 140 may include provisions to mount the panel at a variable height to account for variations in surfaces. Alternatively, this bracket 140 may be mounted to the roof with a threaded bolt or other variable height mounting point. The solar panels can be mounted on a horizontal, vertical or sloped structure or surface utilizing the mounting bracket, In another embodiment a ground mount is attached to the metal plate for attachment to a flat surface or structure. FIG. 4B illustrates a first embodiment of a ground mount 500. The ground mount 500 uses the existing slider channel to mount to flat surfaces. A set screw is inserted in aperture 502 to prevent movement from a determined location and holes 504 allow for the attachments of the solar module to a flat surface or structure. The slider channel allows for near infinite mounting locations on the frame axis.

Figure 4C:
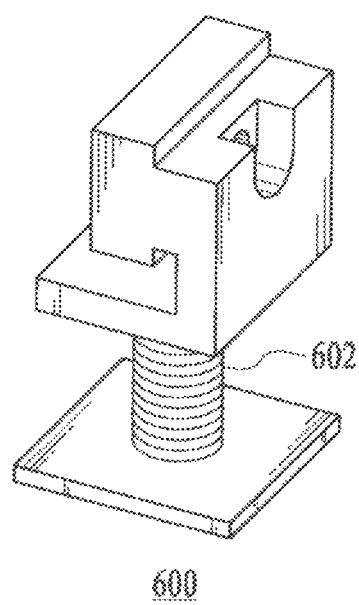
FIG. 4C illustrates a second embodiment of a ground mount.
Figure 4D:
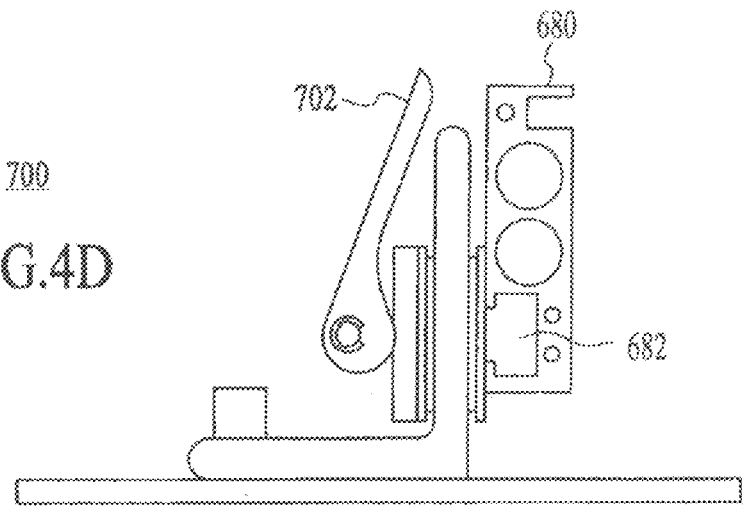
FIGS. 4D and 4E illustrate perspective and side views of an embodiment of a quick release clip.
Figure 4E:
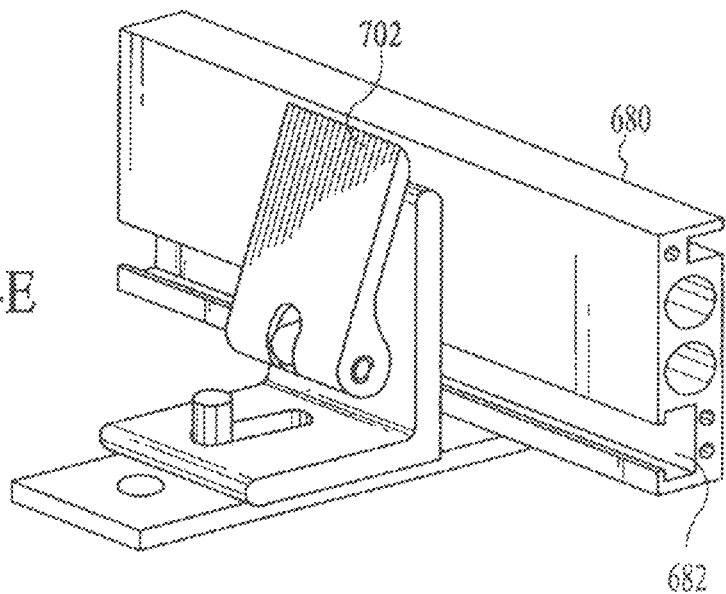
Figure 4F:
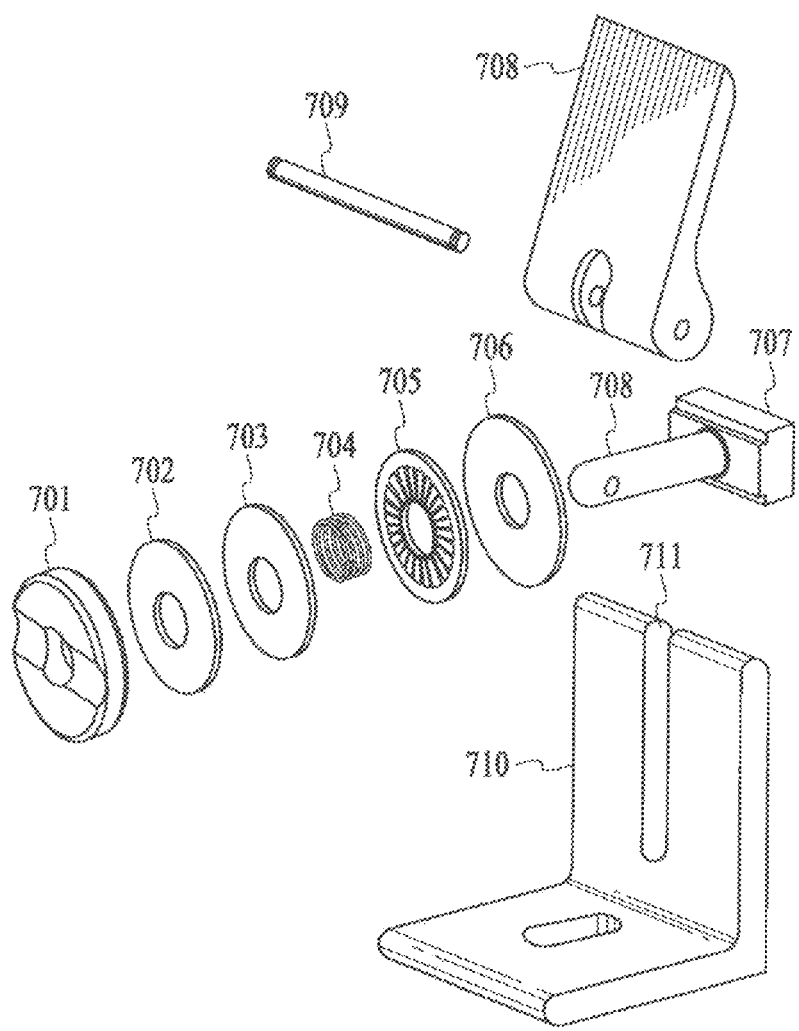
FIG. 4F illustrates an exploded view of the quick release clip.

FIG. 4C illustrates a second embodiment of a ground mount 600 which includes a stud 602, The stud 602 allows for vertical attachments to a racking structure and the set screw prevents movement from a determined location. This ground mount 600 also uses the existing slider channel. Similarly, the slider channel allows for near infinite mounting locations on frame axis Another type of mounting assembly is a quick release clip that is utilized as a mount for a roof or other surfaces and attached to the groove of the module. FIGS. 4D and 4E illustrate a side and perspective view of an embodiment of a quick release clip 700 coupled to a groove 680 of an extrusion 682, The quick release clip 700 replaces bolt and nut assemblies associated with a mounting assembly on a roof or other surface. The quick release clip 700 allows for quick release of modules from a surface without a tool. FIG. 4F illustrates an exploded view of slip release clip 700. The clip 700 includes a support member 701, a first flat washer 702, a bevel washer 703, a coil spring 704, a lock washer 705, a second flat washer 706. The clip 700 also includes an assembly mounting post 707, a cam lever 708, a pin 709 and a L-bracket 710. The clip 700 is assembled such that elements 701-705 are assembled on the post 707. The cam lever is inserted on top of the post 707 via the pin 709. The post 707 is inserted in the groove 711 of the bracket 710. The coil spring 704 separates the elements 701-703 on one side of the L-bracket 710 and 705-706 on the other side of the L-bracket 71.0 such that the cam lever 708 can move the mounting post 707 in and out of the extrusion. By adding and subtracting washers, coarse adjustment for positioning the quick release clip 700 on a surface is provided.

Fine adjustment for positioning the quick release clip 700 is controlled by the position of the cam lever 708.

Secure Stacking of Modules

Finally, solar modules can be securely stacked and shipped with pre-installed mounting brackets, reducing shipping, packing and unpacking costs.

Figure 5A:
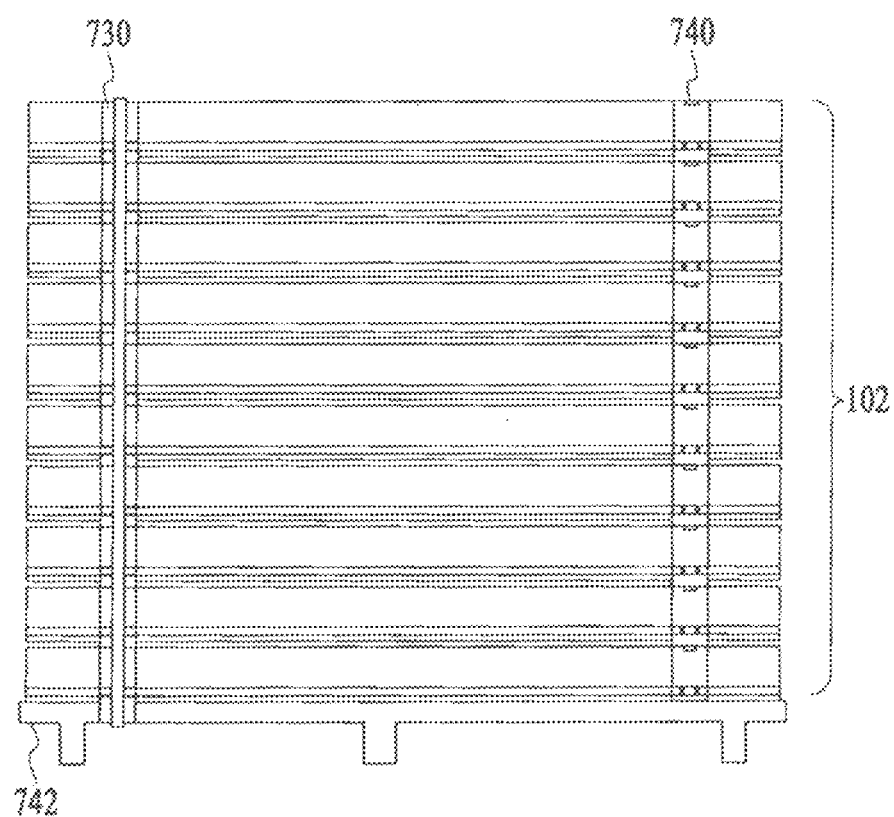
FIG. 5A illustrates a shipping stack of solar modules with pre-installed mounting brackets, through attachment rod and splice storage.
Figure 5B:
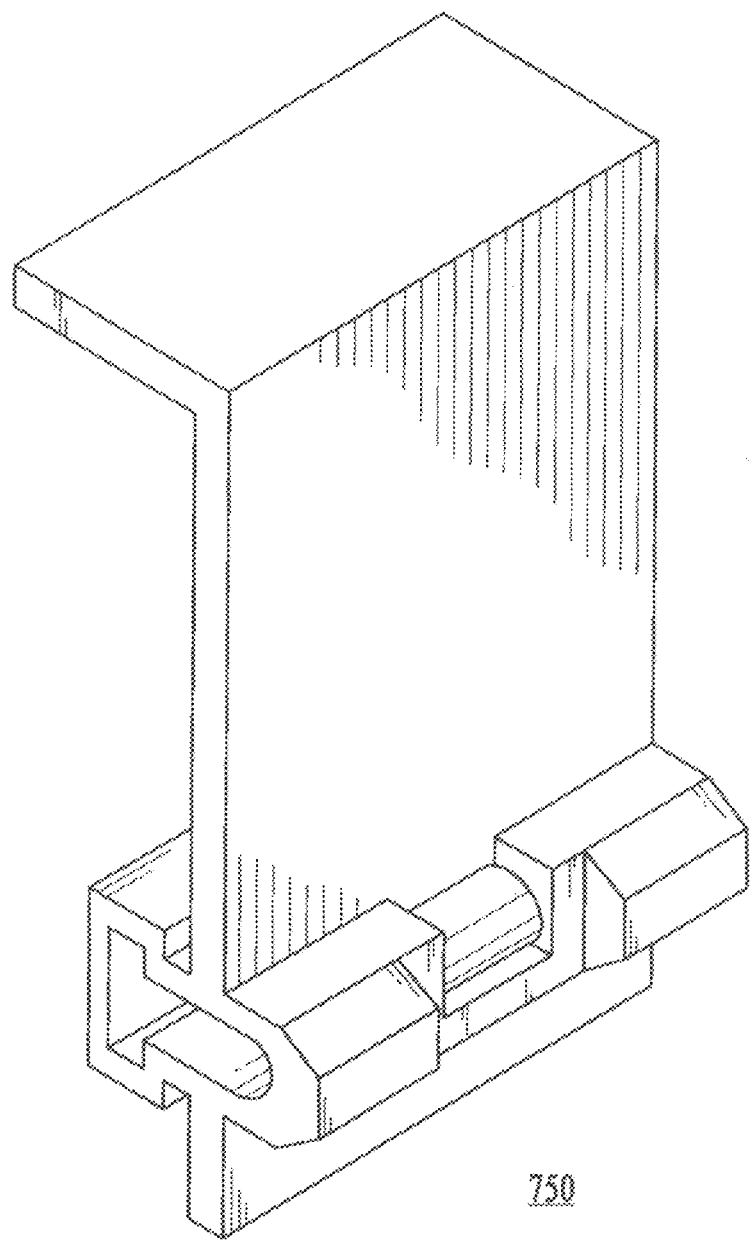
FIG. 5B illustrates a first embodiment of a packing spacer block.
Figure 5C:
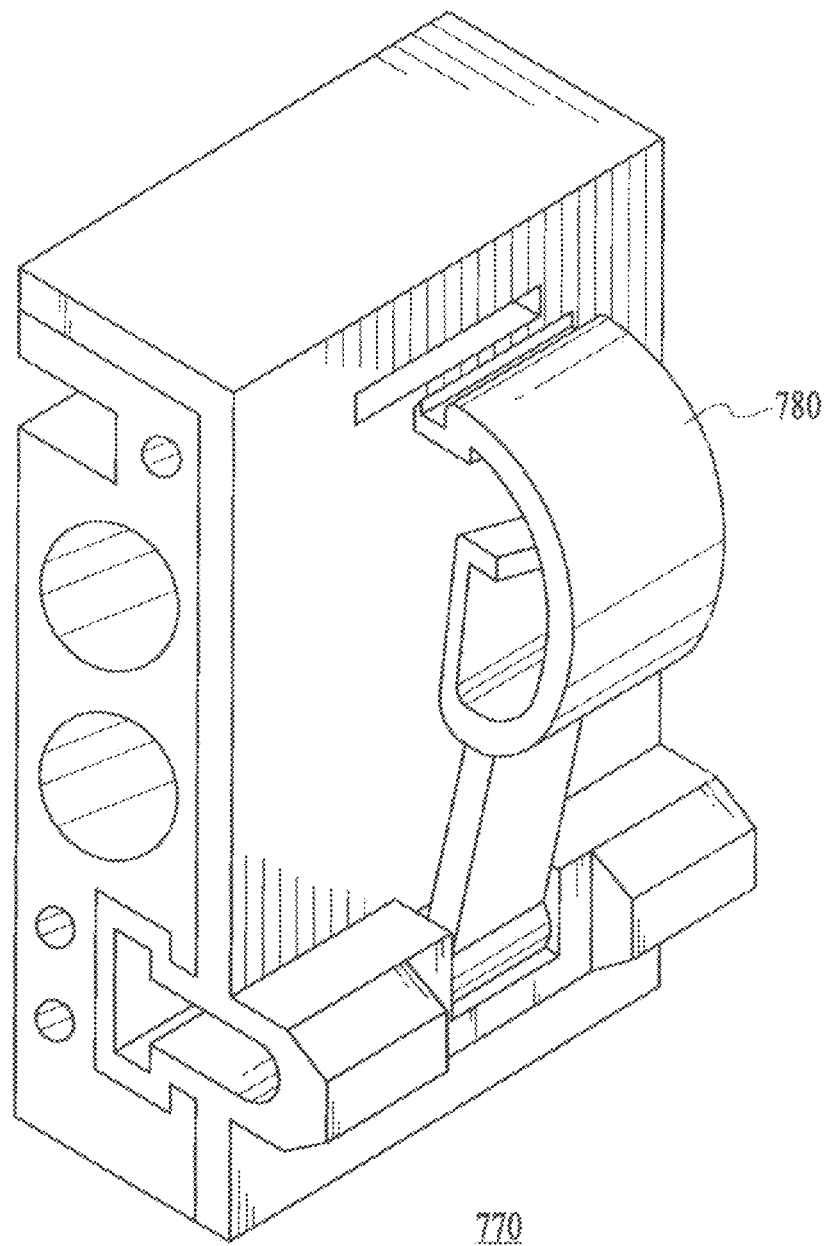
FIG. 5C illustrates a second embodiment of a picking spacer block.

FIG. 5A illustrates how multiple modules 1.02 are securely stacked for shipment on a single palette 742. A plurality of packing spacers 740 is utilized when stacking panels. A packing strap 730 is provided to hold the plurality of modules 102 together, FIG. 5B illustrates an embodiment of a packing spacer block 750. The packing spacer block 752 ensures proper clearances for shipping of stacked modules. A gap (in one embodiment a 0.642" gap) retains the packaging strap 802 (FIG. 5*a*) during shipment of stacked modules. The spacer block 750 also ensures proper clearance and alignment during module installation. A chamfered edge facilitates module alignment during installation. FIG. 5C illustrates a second embodiment of a packing spacer block 770 which includes a channel 780 for holding wiring.

Installation

The following is an example of installation of a solar panel system in accordance with an embodiment. To install the solar panel system requires a mechanical tool kit and an electrical tool kit. The mechanical tool kit comprises a plurality of tools such as a ratchet, a driver, a wrench, a socket and a wire cutter all of which are of a standard size. The mechanical tool kit also includes a plurality of custom tools. Those tools include a connector tool, a wrench for the splices and a screw driver for tightening the splices.

Figure 6:
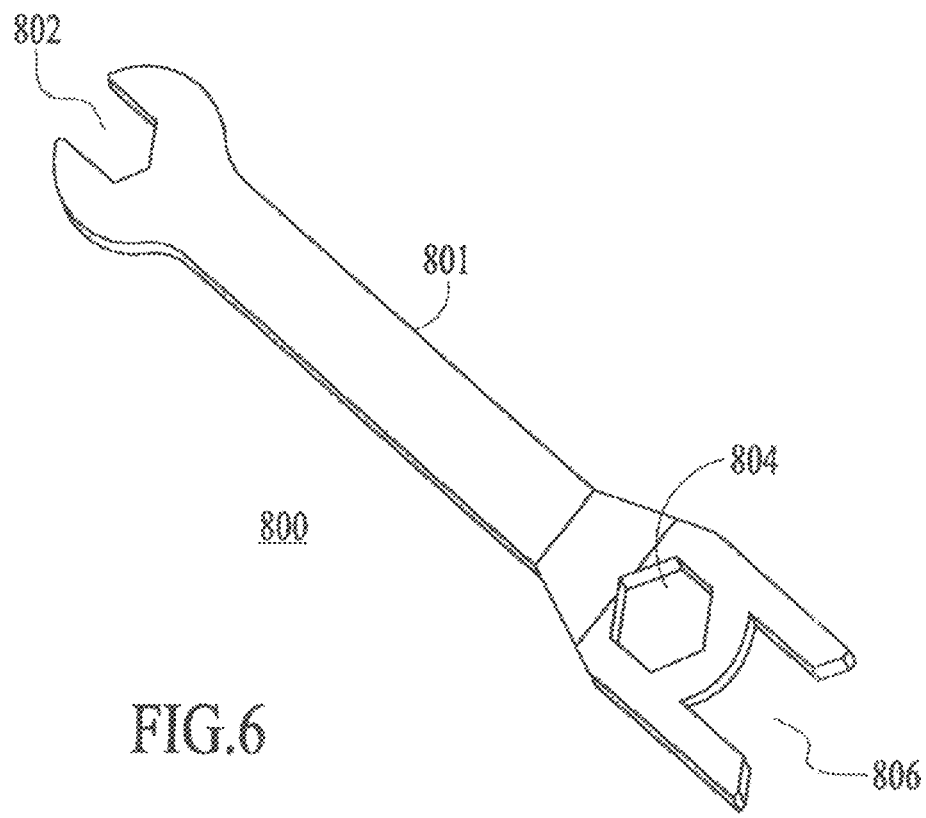
FIG. 6 illustrates a wrench for a cam lock for a splice and a connector unlock for a module.
Figure 7:
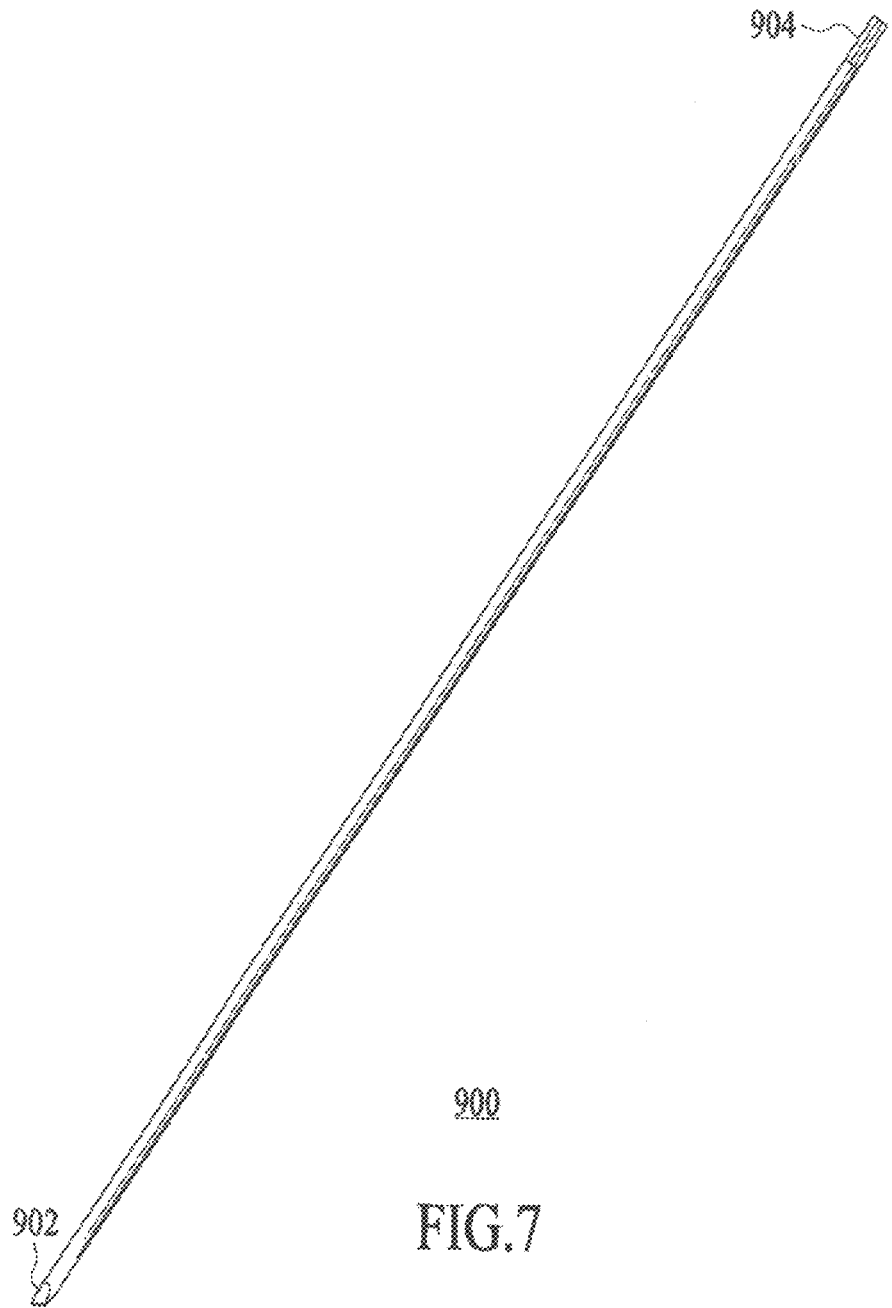
FIG. 7 illustrates an embodiment a driver for the splices of FIGS. 3A and 3B.

The electrical tool kit comprises a custom multipurpose wrench, a wire cutter, a wire stripping tool and a plug maker tool. To describe the features of the custom tools in more detail refer now to the following:

FIG. 6 illustrates the custom multipurpose wrench 800. The wrench 800 includes a body portion. The body portion 801 at one end includes an opening 802 for setting a cam lock for a splice. The body portion 801 also includes at an opposite end a second opening 806 for unlocking a connector for a module. The body portion further includes a third opening 804 between the first and second openings 802 and 806 for driving a double screw lock splice, FIG. 7 illustrates an embodiment of a driver 900 for the splices of FIGS. 3A and 3B. The driver engages a driver end 902 of a splice to drive modules together. The driver drives the splice through insertion of the driver 900 through a module frame through-hole. In one embodiment a hex end 904 of the driver 900 can be attached to an off the shelf hand ratchet. The driver 900 joins and separates modules through the module frame through hole. Different versions of drivers such as Phillips, etc., can be attached to different drive heads.

Figure 8:
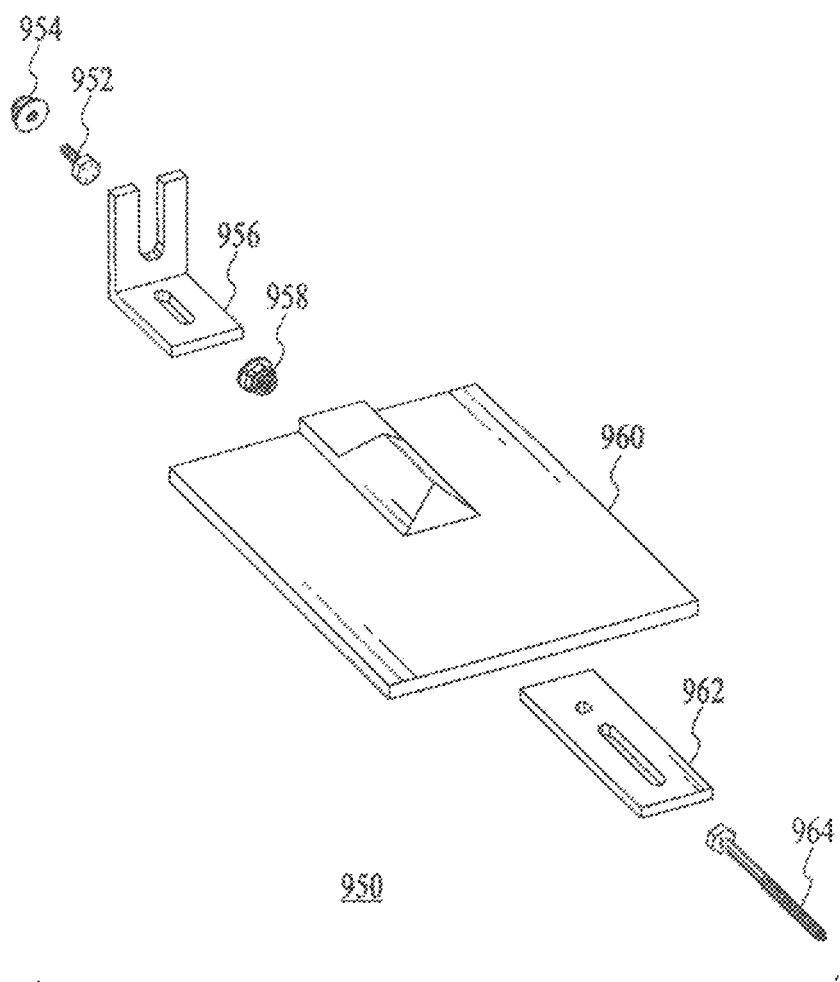
FIG. 8 illustrates an exploded view of a mounting hardware for the solar panel system.

The solar panel system may be mounted over a fire resistant roof covering rated for the application. The minimum mechanical means to be used for securing of the pane] to the roof are particular to the roof type, e.g. composition, slate, barrel tile, cement tile, wood shake, foam core, tar and gravel, metal seam, and slate. The minimum mechanical means (attachment points) are shown in the offered in the diagrams below. Note that the specific number of attachment points should be appropriate to the roof type, local building code, and wind, snow, and seismic loading conditions. The mounting hardware is shown in FIG. 8, The hardware 950 comprises a bolt 952, a first lock nut 954, L-bracket 956, a second lock nut 950, flashing 960, a standoff plate 962 and a lag bolt 964. Spacer blocks and shim blocks are also used in assembling the solar panels.

Figure 9:
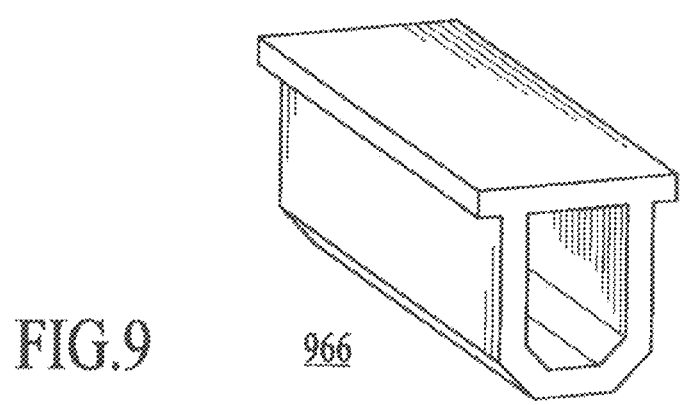
FIG. 9 illustrates an embodiment of a north-south (N-S) spacer block.

FIG. 9 illustrates an embodiment of a north-south (N-S) spacer block 966. The N-S spacer block ensures proper spacing between modules. The spacer block 960 is a general spacer block and can be removed after installation. The N-S spacer block 964 can also be used as conduit to hold loose wire.

Figure 10A:
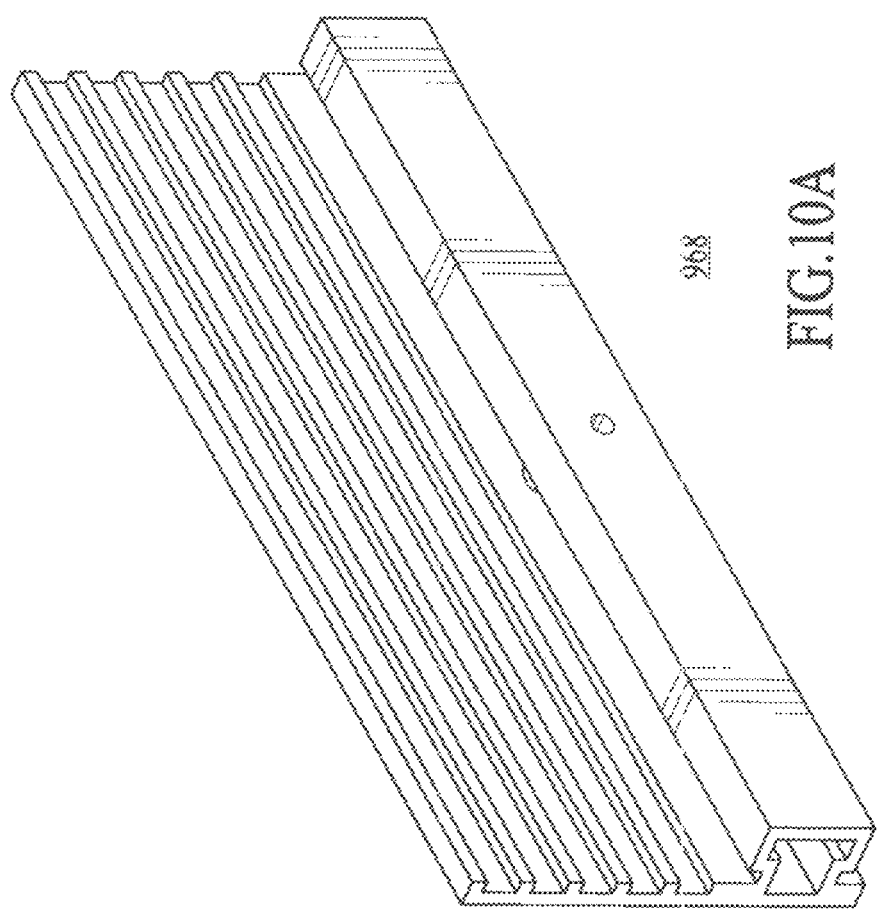
FIG. 10A illustrates an embodiment of a shim block.
Figure 10B:
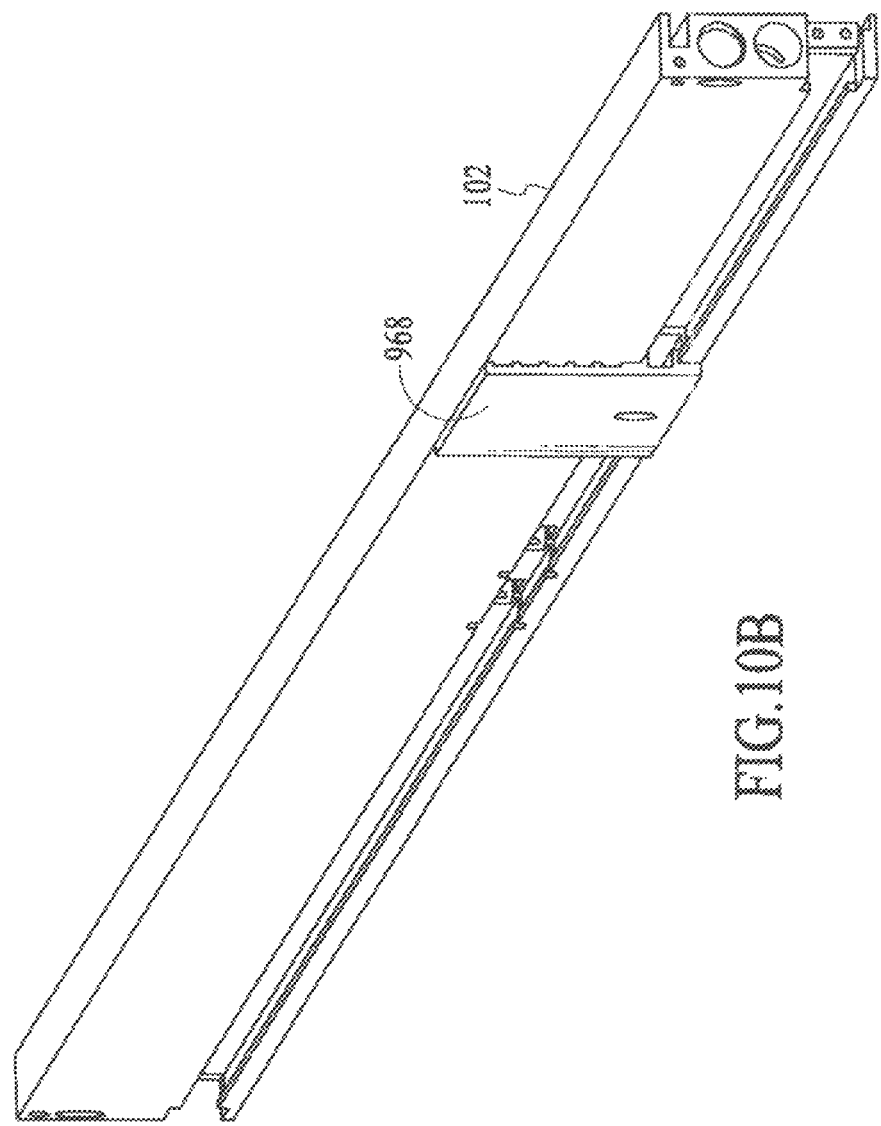
FIG. 10B illustrates a shim block located on a solar panel.
Figure 10C:
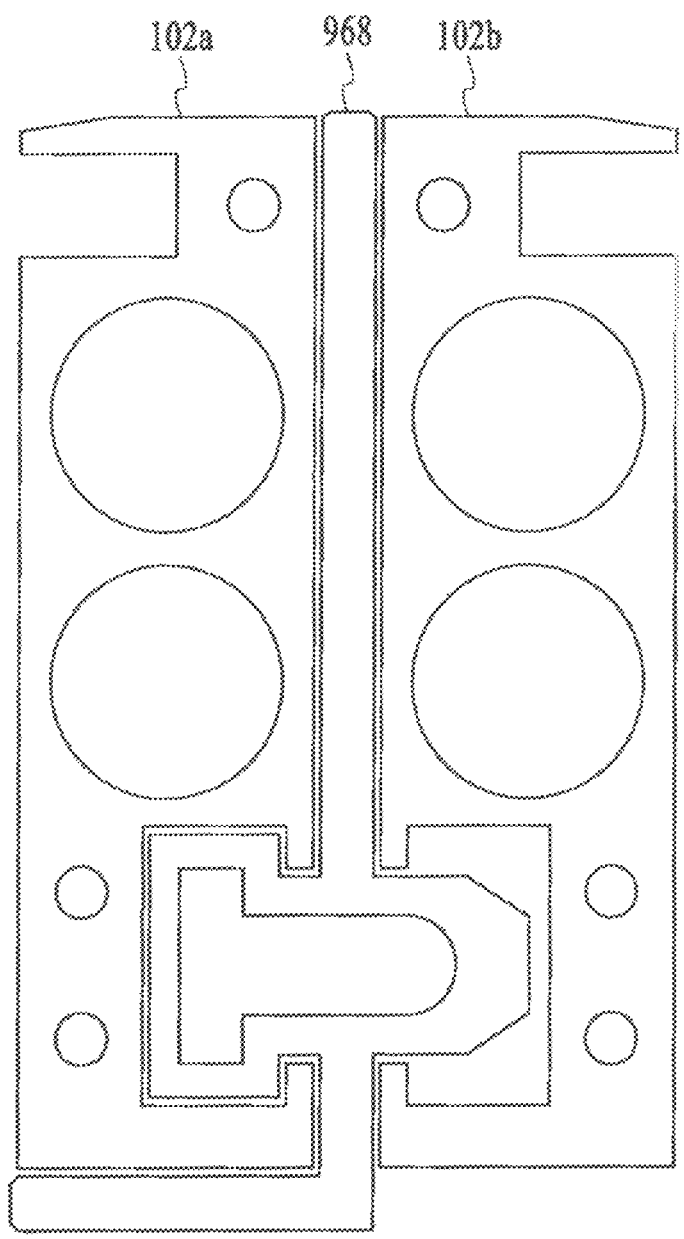
FIG. 10C illustrates a shim block between solar panels to minimize over-tightening.

FIG. 10A illustrates an embodiment of a shim block 960. The shim block 960 ensures that proper clearances between modules. FIG. 10B illustrates a shim block 960 on a panel 102. FIG. 10C illustrates a shim block 960 between two solar panels 1.02a, 102b for minimizing over-tightening.

By utilizing the above tools and hardware the solar panel system can then be installed with ease.

Mechanical Installation

Below is a description of the installation of the solar panel system in accordance with an embodiment.

Figure 11:
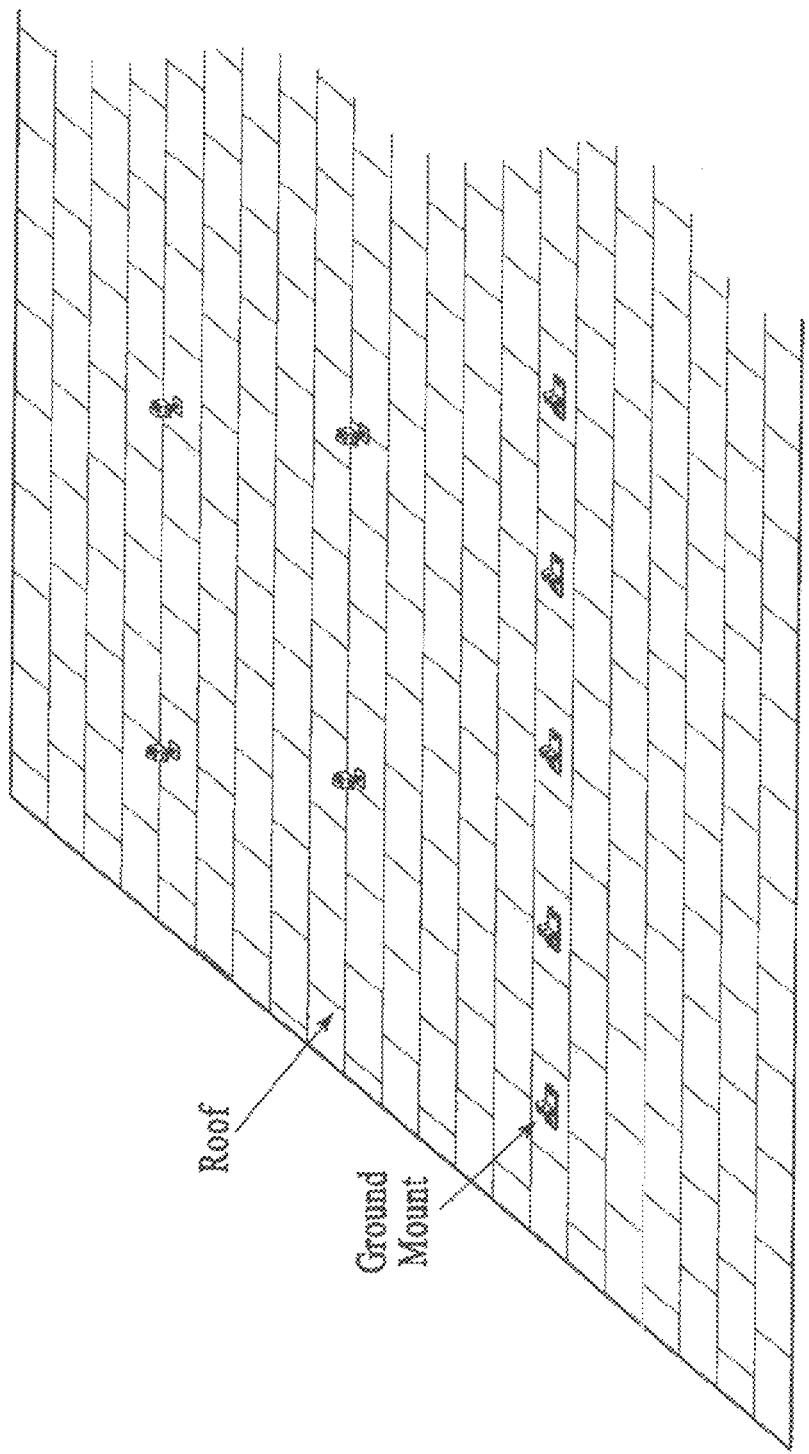
FIG. 11 illustrates installing mounting hardware.

Step 1. The mounting hardware (FIG. 11) Is installed—A flat standoff late is mounted directly to a rafter using a hex lag bolt. Flashing and the L bracket are mounted to the flat standoff plate.

Figure 12:
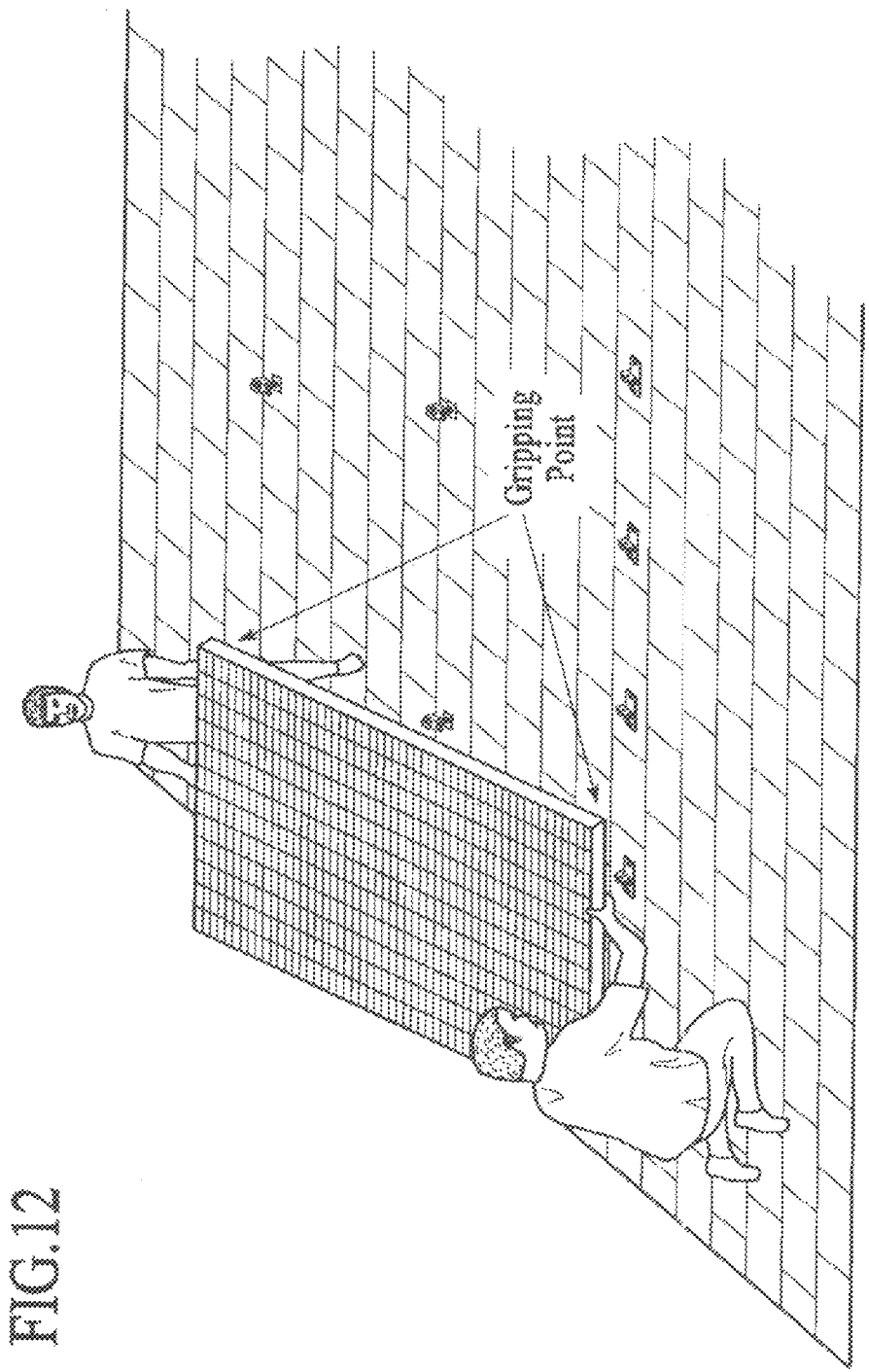
FIG. 12 illustrates positioning panels over the mounting locations.

Step 2. The panels are positioned over the mounting location (FIG. 12). Attachment points should be installed so that the top and bottom of the module fit precisely between the attachment points. A bolt is inserted into both the top and bottom frame extrusion and is fasted to the slotted L bracket by a flanged lock nut.

Figure 13:
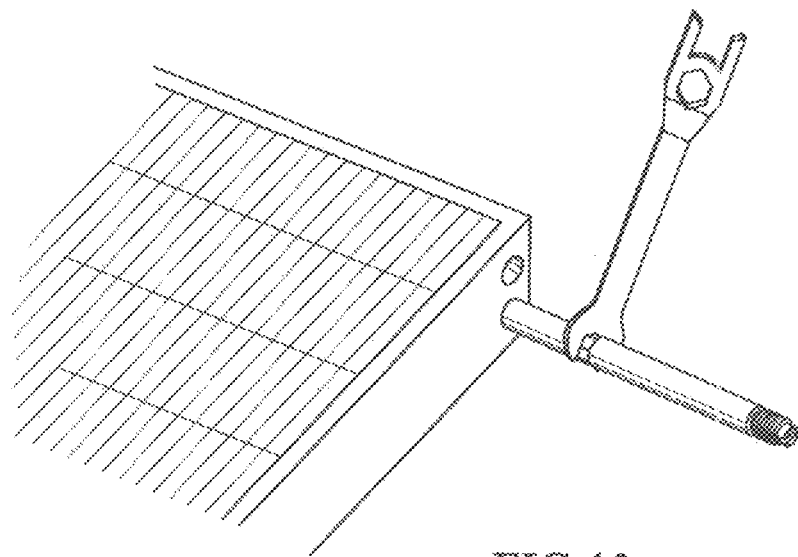
FIG. 13 illustrates inserting splices into the frame.

Step 3. The splices are inserted (FIG. 13) into the frame. In an embodiment two splices are inserted into the frame on the long edge of the module using a custom tool. The first splice will connect the top frame of the module and the bottom will connect to bottom frame of the module. When tightened together, the two splices will draw two modules together and will act as a structural member as well as a grounding bond.

Figure 14:
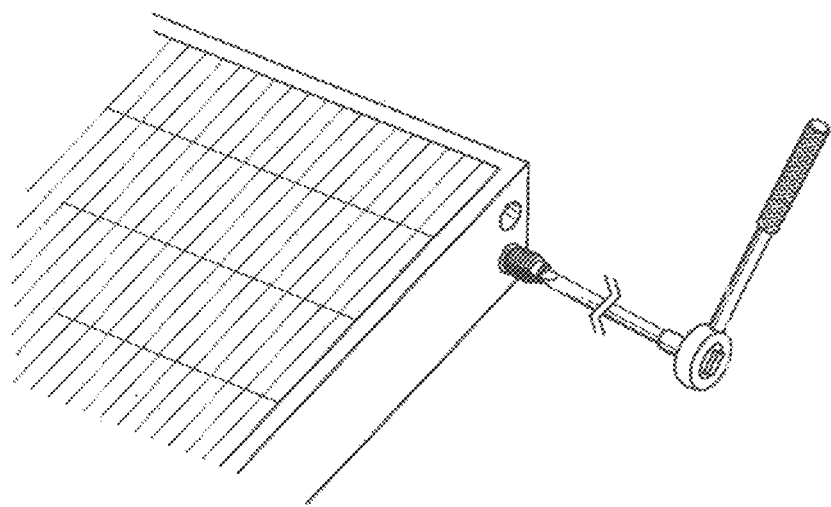
FIG. 14 illustrates an array assembly being coupled together.

Step 4. An array assembly is coupled using the splice (FIG. 14). The solar panels will be drawn together using either the custom wrench between the modules or by using the custom driver. The custom driver is inserted through the frame through hole using a ratchet driver. Both the top and bottom splice should be secured at the same rate. The assembly sliding motion will ensure that the pair of connectors on the side of the module snap in securely to the neighboring panel. The shim block on the long edge of the module will prevent over insertion.

Step 5, Next, the splices are fully tightened, using the custom driver and ratchet. Utilizing a shim block will prevent over-tightening.

Step 6. Thereafter, the bolts are fully tightened. The custom wrench is utilized to fully tighten the bolts on the L bracket assembly and attachment points.

Step 7. Finally, the above steps are repeated to assemble the desired number of modules in the string.

North-South Assembly

Figure 15A:
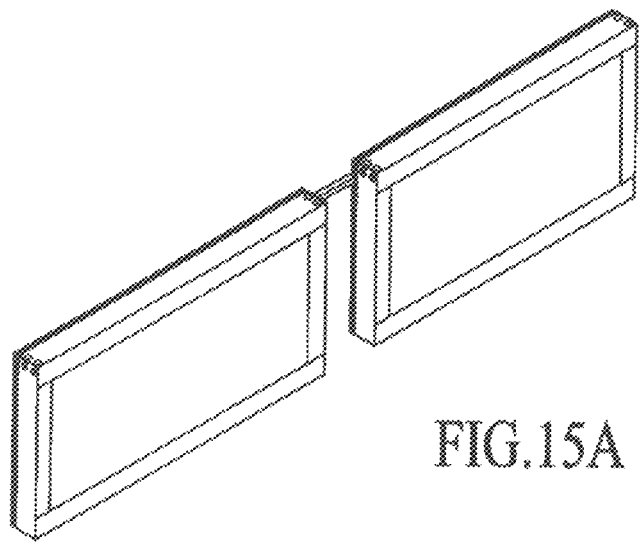
FIGS. 15A-B shows the splice entering the opening in the panel (n-s) direction.
Figure 15B:
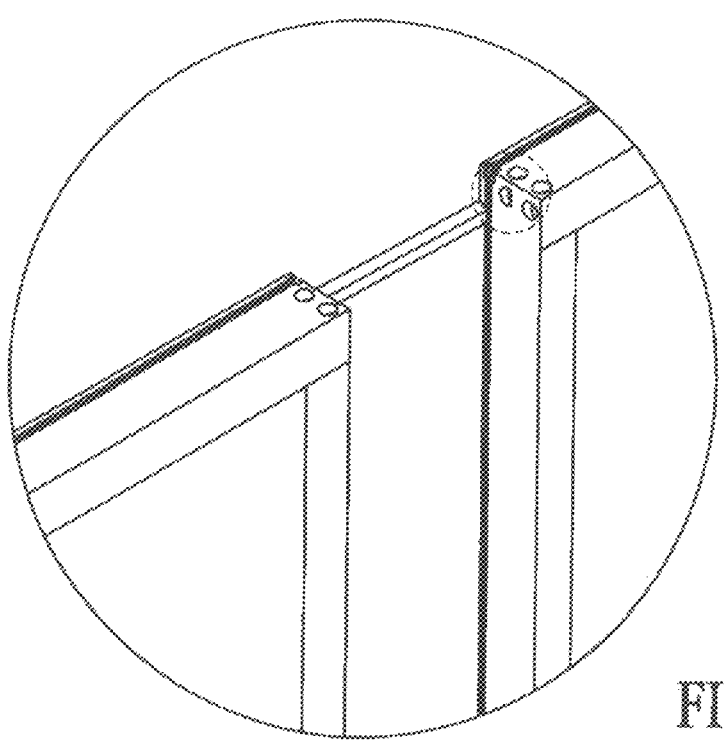

After the modules are assembled in a string into a solar panel, one or more solar panels needed to be assembled in a north-south (N-S) direction, FIGS. 15A-D show that N-S assembly. FIG. 15A-B shows the splice entering can opening in a panel (N-S) direction. The flat on the splice faces up. There is also a flat in the opening where the splice can engage when the flat on the splice is up.

Figure 15C:
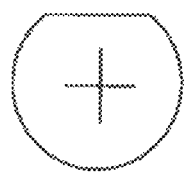
FIG. 15C shows the splice flat up upon entry.
Figure 15D:
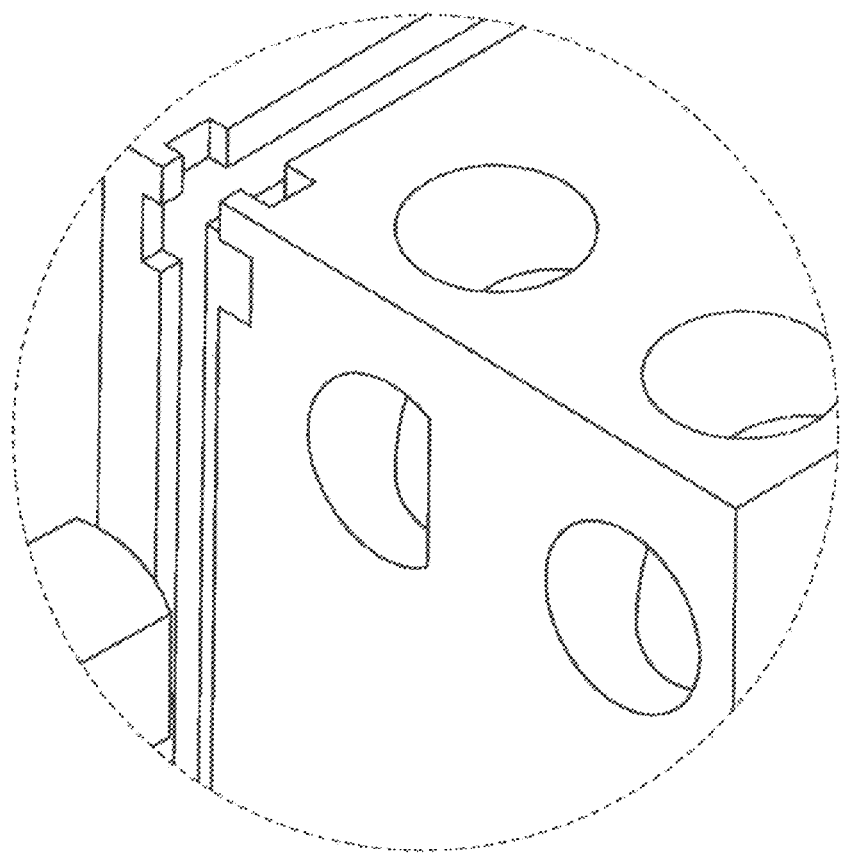
FIG. 15D shows, after entry, the splice is rotated and the round on the splice jams in the flat.

FIG. 15C shows the splice flat up upon entry into the panel. FIG. 15D shows, after entry, the splice is rotated and the round surface on the splice jams in the flat on the splice. By utilizing the splice in this manner, solar panels can be assembled in the north-south direction.

Electrical Installation

Figure 16:
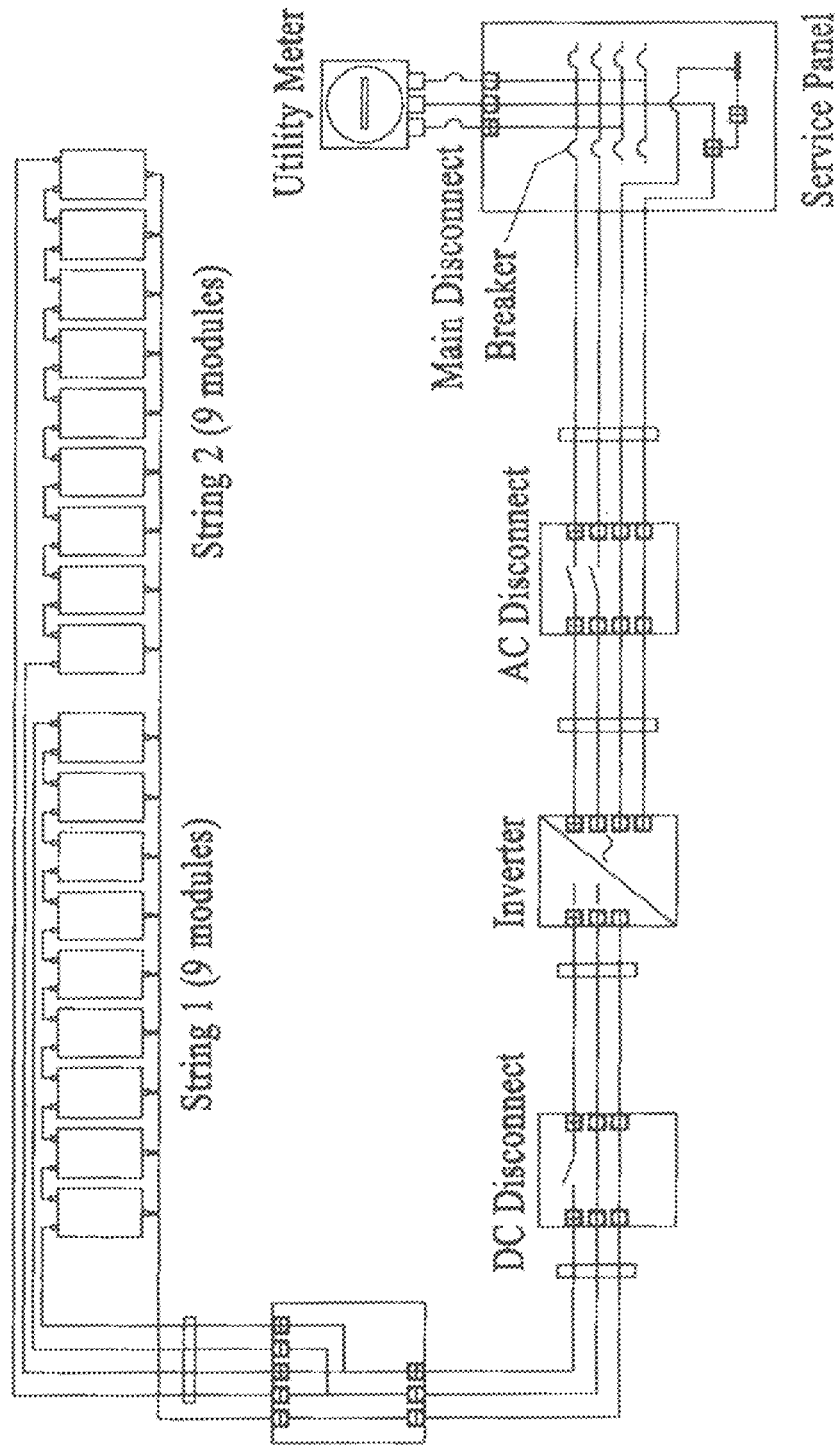
FIG. 16 illustrates an example of an electrical schematic for proper wiring.
Figure 17:
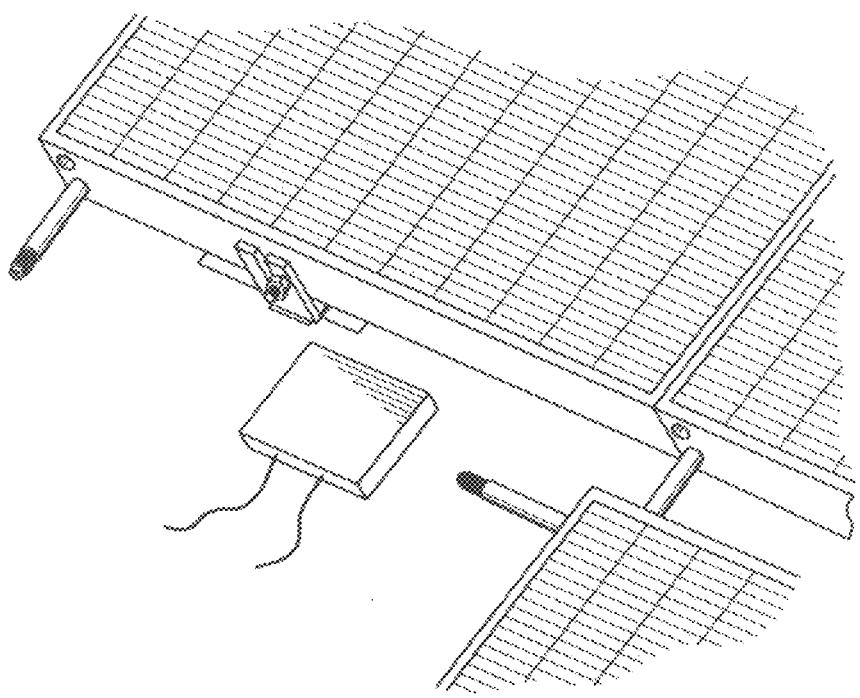
FIG. 17 illustrates an inter-module grounding splice.

The modules can be interconnected in series or in parallel by connecting the positive and negative leads from the module junction box as desired. For easiest electrical installation, modules should be connected in series to form strings. Strings can then be easily wired in series or parallel, An example electrical schematic for proper wiring is shown in FIG. 16. Note the inter-module, inter-string, and panel array to conductor box and inverter wiring, Grounding For the solar panel system, inter-module grounding is achieved via splices and inter-string grounding is achieved via bare copper wire connected between grounding lugs, Inter-module Grounding—To ensure proper grounding between modules, the splice must be fully threaded into each panel until the splice is butted against the grounding nut interior to the frame. Splices can be used for grounding between modules for connections along the long edge of the modules. Splices connected along the short edges of the modules are mechanical only, and do not provide grounding. FIG. 17 illustrates two inter-module grounding splices.

Inter-string Grounding—On the end of a string of modules, attach a grounding lug to the frame of one module using the grounding screw. Ensure that in fastening the grounding screw, the black anodized surface of the module frame has been scratched to remove the non-conductive black coating of the aluminum frame. Then, between two modules located on separate strings, connect the grounding lugs with at a bare copper wire.

Panel to Conductor Box Grounding—On the end of a string of modules, attach a grounding lug to the frame of one module using the grounding screw. Then, the grounding lug L is connected to a combiner box with copper wire or use the combiner box itself to provide the grounding.

Now, the electrical connectors for the solar module that may be integrated into the frame of the solar module (shown in FIG. 2A) will be described in more detail.

Figure 18A:
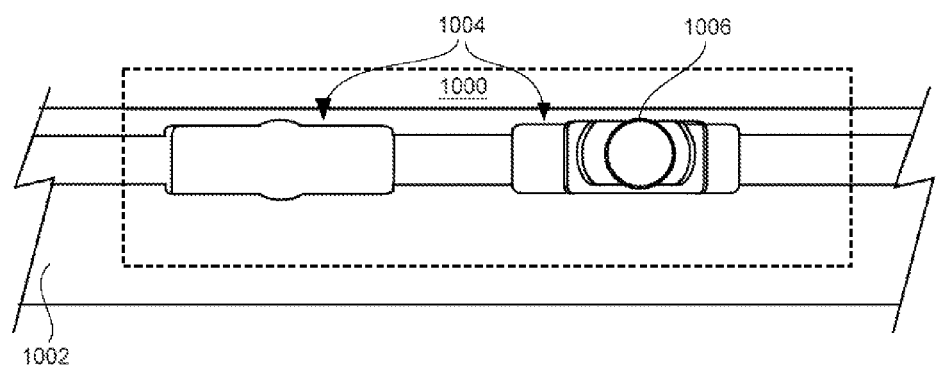
FIGS. 18A and 18B illustrate an electrical connector integrated into the frame of the solar module.
Figure 18B:
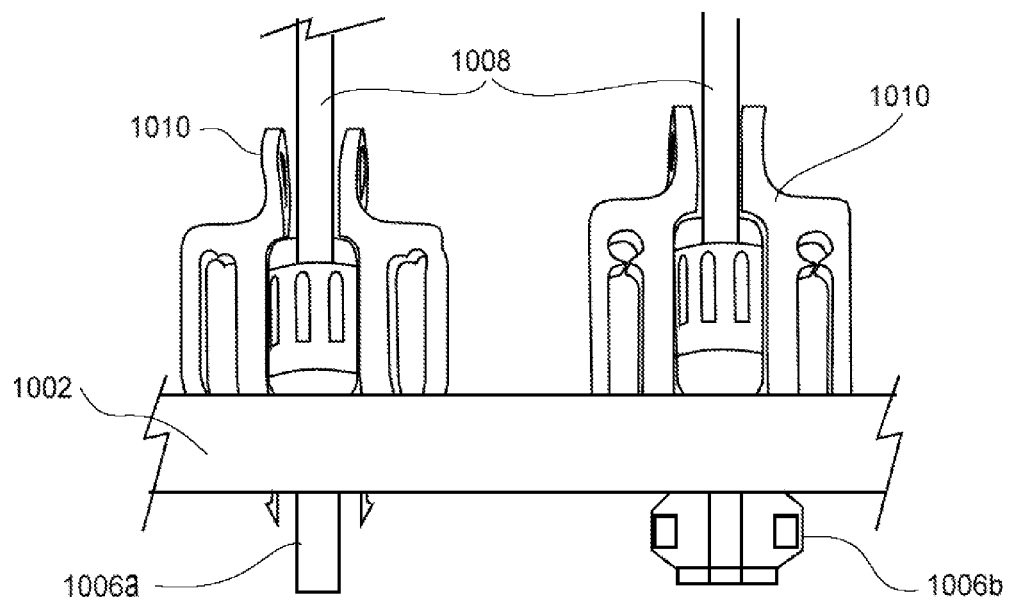

FIGS. 18A and 18B illustrate an electrical connector integrated into the frame of the solar module. In particular, FIG. 18A illustrates the set electrical connectors 1000 integrated into a frame member 1002 wherein the set of electrical connector may further comprise one or more pockets 1004 (two are shown in the embodiment in FIG. 18A) into which an electrical connector 1006 and a connector holder 1010 (shown in FIG. 18B) may releasably or permanently affixed. Each electrical connector 1006 may have an electrical lead 1008 attached to it. Each pocket 1004 in the frame member 1002 is sized so that the electrical connector 1006 and the connector holder 1010 may be moved laterally, vertically and/or angularly within the pocket and still maintain the electrical connection with the next solar module. As shown in FIG. 18B, the electrical connector 1006 and holder 1010 pass through the frame member 1002 and releasably or permanently affix the electrical connector to the frame member 1002 so that electrical connection between two adjacent solar modules can be made. In each solar module, there may be a male connector 1006a and a female connector 1006b (as shown in FIG. 18B) and the male and female connectors 1106a, 1006b of one solar module electrically mate with the corresponding female and male connectors on an adjacent solar module or with a junction box 121, 121', 121" as shown in FIGS. 2A-2D. Each of the male and female connectors have electrical connectors inside them that are electrically connected together when the male and female connectors are connected to each other. Each holder 1010 for the male and female connectors are similar and allow the particular electrical connector to be positioned so that the connectors can be mated with the adjacent solar modules and/or the junction box.

FIGS. 18C1-18C5 illustrate various views of the electrical connector shown in FIGS. 18A and 18B. As shown in FIGS. 18C1 and 18C2, each connector has a notation 1020, such as example + sign that is in the surface of the connector to ensure that the electrical connectors are connected correctly when the solar modules are installed. For example, each solar module may have a positive voltage connector and a negative voltage connector (for AC power) and the notations 1020 ensure that the connectors for adjacent solar modules are connected to each other properly so that the solar modules are electrically connected properly. These figures also show the male connector 1006a with a first embodiment of the connector holder 1010 installed.

Figure 19:
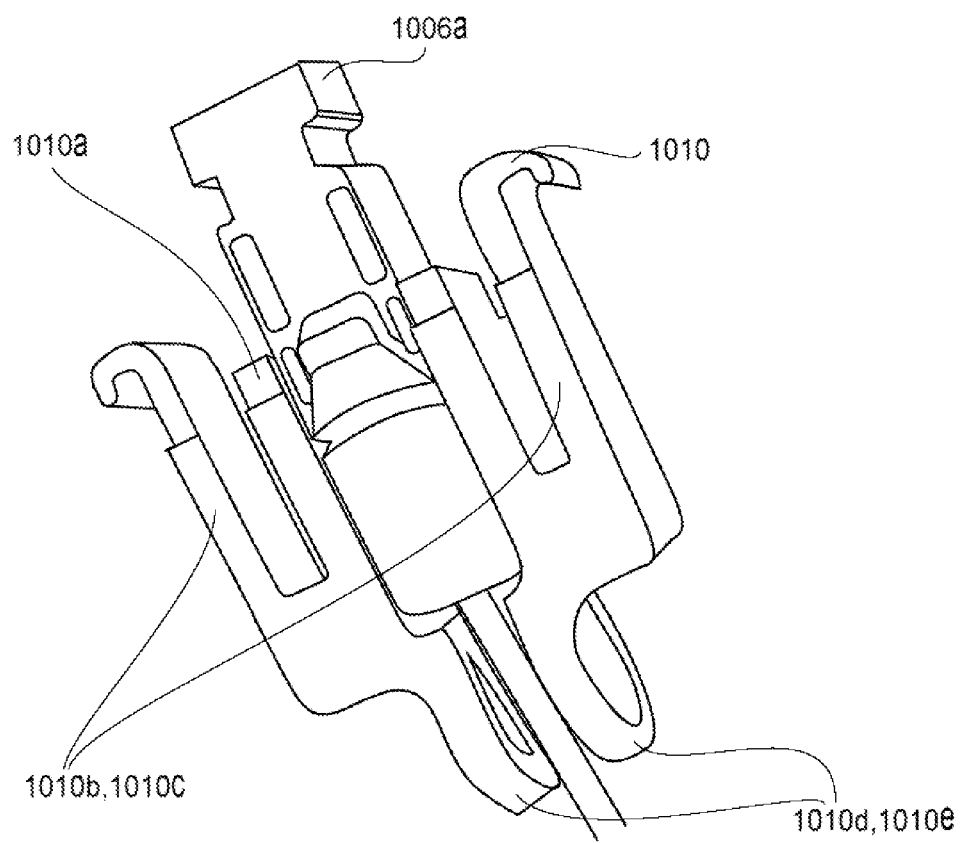
FIGS. 19 and 20 illustrate another embodiment of the connector holder and connector of an electrical connector.
Figure 20:
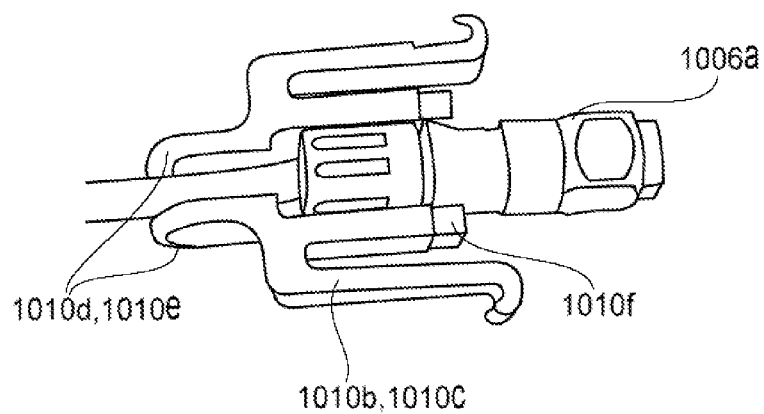

FIG. 19 illustrate an embodiment of the connector holder 1010. As shown, the holder 1010 may be made of a resilient material, such as a plastic or a metal material, etc. and may further comprise a body portion 1010a, a first and second wing portions 1010b, 1010c which is resilient and are biased away from the body portion 1010a. In operation, as the connector holder 1010 and connector 1006 are inserted into the pocket in the frame member 1002, the first and second wing portions 1010b, 1010c are forced towards the body portion 1010a and then spring back out to hold the connector 1006 in the pocket of the frame member. The holder 1010 may further comprises a first and axial portions 1010d, 1010e, that may be biased closed, located at the bottom of the body portion 1010a as shown in FIG. 19 that allow the axial position of the connector 1006a (into or out of the holder) to be adjusted wherein the axial portions, when closed, hold the electrical lead 1008. As shown in FIG. 20, the holder 1010 may further comprise a holder pocket portion 1010f that provides room to permit the axial location of the connector 1006 (in and out of the holder) to be adjusted. As shown in FIG. 20, two holders 1010 and connectors 1006a are shown in which the connector 1006a is in a retracted position in one holder/connector assembly shown on the left side of FIG. 20 and is in an extended position in the other holder/connector assembly shown on the right side of FIG. 20. As described above, the axial position of the connector 1006a may be adjusted by compressing the axial portions 1010d, 1010e and then adjusting the position of the connector 1006a. Once the proper axial position of the connector 1006 is achieved (when installing the solar modules), the axial portions 1010d, 1010e can be released and the connector is held in its desirable axial position. Now, another embodiment of a female and male electrical connector are described.

FIG. 21A-E are a perspective view, a right view, a front view, a left view and a end view, respectively, of another embodiment of a female electrical connector 1006b that may be connected to the male connector to establish an electrical connection between adjacent solar modules. This embodiment of the female connector has the electrical lead 1008 and the connector holder. In the embodiment, the connector holder 1028 is integrated into the electrical connector and has a first and second portions 1028a, 1028b that have a spring effect to secure the electrical connector to the frame using a first and second latching portions 1028e, 1028f as shown in FIG. 21A that are located at an end of each first and second portions 1028a, 1028b. In one implementation, each portion 1028a, 1028b may have a u shape. The electrical connector 1006b also has a mating portion 1030 that can be mated with a corresponding mating portion of the male connector as shown in FIGS. 22A-22E. The electrical connector 1006b also has one or more electrical contacts 1032 that electrically connect to corresponding electrical contacts of the male connector as shown in FIGS. 22A-22E.

FIGS. 22A-E are a perspective view, a right view, a front view, a left view and a end view, respectively, of another embodiment of a male electrical connector 1006a that can be used with the female connector 1006b of FIGS. 21A-21E to establish an electrical connection between adjacent solar modules. This embodiment of the male connector has the electrical lead 1008 and the connector holder. In the embodiment, the connector holder 1028 is integrated into the electrical connector and has a first and second portions 1028a, 1028b that have a spring effect to secure the electrical connector to the frame using a first and second latching portions 1028r, 1028f as shown in FIG. 21A that are located at an end of each first and second portions 1028a, 1028b. In one implementation, each portion 1028a, 1028b may have a u shape. The electrical connector 1006b also has the mating portion 1030 and the one or more electrical contacts 1032 that electrically connect to corresponding electrical contacts of the female connector.

In one implementation, the female shown in FIGS. 21A-E may be used with a retractable electrical connector as will now be described in FIGS. 23A-B and 24A-B. In particular, the electrical connector has the capability to retract into the frame of the solar module so that, during shipping and movement of the solar module, any protrusion is eliminated from the panel. When the one or more electrical connector(s) are in the retracted position, the electrical connectors cannot be damaged by hitting or getting caught on something outside of the panel during transit. Later, when ready for installation, the connector can be moved into an install position where it protrudes from the panel for interconnection with an adjacent panel. Now, an implementation of the retractable electrical connector is described in more detail.

FIGS. 23A and 23B are a side view and a sectional view along line A-A, respectively, of the female connector of FIGS. 21A-E in an retracted position and FIGS. 24A and 24B are a side view and a sectional view along line A-A, respectively, of the female connector of FIGS. 21A-E in an install position. The female electrical connector has the same elements as described above. In the retracted position, the first and second latching portions 1028e, 1028f are attached to a back portion of the frame 1002. Then, when the female connector is moved into the install position (by pushing in the first and second portions 1028a, 1028b) so that the female electrical connector is moved out and then the first and second latching portions 1028e, 1028f connect to the outer portion of the frame 1002 as shown in FIGS. 24A-B.

Although the system has been described in accordance with the embodiments shown, one of ordinary skill in the art will readily recognize that there could be variations to the embodiments and those variations would be within the spirit and scope of the system. For example, although the splice is preferably made of a conductive material such as aluminum, it could be made utilizing a non-conductive material which has a conductive capability added to its surface and its use would be within the spirit and scope of the system. Accordingly, many modifications may be made by one of ordinary skill in the art without departing from the spirit and scope of the appended claims.

The invention claimed is:
1. A solar module, comprising:
a solar panel;
a frame having two side frame members and a top frame member and a bottom frame member connected together to form a frame that surrounds the solar panel;
a first connector window in one of the side frame members;

a first electrical connection being coupled to the first connector window so that the first electrical connection is integrated into the frame of the solar module; and wherein the first electrical connection further comprises an electrical connector and a connector holder wherein the electrical connector is seated in the connector holder, the connector holder mates with the first connector window and the connector holder allows a position of the electrical connector to be moved one of vertically, horizontally, axially and angularly with respect to the frame.

2. The solar module of claim 1 further comprising a second connector window in the one of the side frame members adjacent to the first connector window, and a second electrical connection being coupled to the second connector window so that the first and second electrical connections are integrated into the frame of the solar module.

3. The solar module of claim 2, wherein the first electrical connection is a female electrical connection and the second electrical connection is a male electrical connection that ensure the electrical connection to the solar module is properly made.

4. The solar module of claim 2, the second electrical connection further comprises a second electrical connector and a second connector holder wherein the second electrical connector is seated in the second connector holder, the second connector holder mates with the second connector window and the second connector holder allows a position of the second electrical connector to be moved one of vertically, horizontally, axially and angularly with respect to the frame.

5. The solar module of claim 4, wherein each of the respective connector holders further comprises a body portion, a first resilient wing portion attached to the body portion and a second resilient wing portion attached to the body portion wherein the first and second resilient wing portions mate with the respective connector window.

6. The solar module of claim 5, wherein each connector holder further comprises a first axial portion attached to the respective body portion and a second axial portion attached to the respective body portion wherein the first and second axial portions permit the respective electrical connector to be moved axially within the respective connector holder.

7. The solar module of claim 1, wherein the connector holder further comprises a body portion, a first resilient wing portion attached to the body portion and a second resilient wing portion attached to the body portion wherein the first and second resilient wing portions mate with the first connector window.

8. The solar module of claim 7, wherein the connector holder further comprises a first axial portion attached to the body portion and a second axial portion attached to the body portion wherein the first and second axial portions permits the electrical connector to be moved axially within the connector holder.

9. A solar assembly, comprising:
a first solar module;
a second solar module electrically connected to the first solar module;
the first solar module further comprising a solar panel, a frame having two side frame members and a top frame member and a bottom frame member connected together to form a frame that surrounds the solar panel, a first connector window in one of the side frame members and a first electrical connection being coupled to the first connector window so that the first electrical connection is integrated into the frame of the solar module;

the second solar module further comprising a solar panel, a frame having two side frame members and a top frame member and a bottom frame member connected together to form a frame that surrounds the solar panel, a second connector window in one of the side frame members and a second electrical connection being coupled to the second connector window so that the second electrical connection is integrated into the frame of the solar module; and wherein each respective electrical connection further comprises an electrical connector and a connector holder wherein the electrical connector is seated in the connector holder, the connector holder mates with the respective connector window and the connector holder allows a position of the electrical connector to be moved one of vertically, horizontally, axially and angularly with respect to the frame.

10. The solar assembly of claim 9 further comprising a third connector window in the one of the side frame members adjacent to the first connector window, and a third electrical connection being coupled to the third connector window so that the first and third electrical connections are integrated into the frame of the first solar module.

11. The solar assembly of claim 10, wherein the first electrical connection is a female electrical connection and the third electrical connection is a male electrical connection that ensure the electrical connection to the solar module is properly made.

12. The solar assembly of claim 10, wherein the third electrical connection further comprises a third electrical connector and a third connector holder wherein the third electrical connector is seated in the third connector holder, the third connector holder mates with the third connector window and the third connector holder allows a position of the third electrical connector to be moved one of vertically, horizontally, axially and angularly with respect to the frame.

13. The solar assembly of claim 12, wherein each of the respective connector holders further comprises a body portion, a first resilient wing portion attached to the body portion and a second resilient wing portion attached to the body portion wherein the first and second resilient wing portions mate with the respective connector window.

14. The solar assembly of claim 13, wherein each of the respective connector holders further comprises a first axial portion attached to the body portion and a second axial portion attached to the body portion wherein the first and second axial portions permits the respective electrical connector to be moved axially within the respective connector holder.

15. The solar assembly of claim 9, wherein each of the respective connector holders further comprises a body portion, a first resilient wing portion attached to the body portion and a second resilient wing portion attached to the body portion wherein the first and second resilient wing portions mate with the respective connector window.

16. The solar assembly of claim 15, wherein each of the respective connector holders further comprises a first axial portion attached to the body portion and a second axial portion attached to the body portion wherein the first and second axial portions permits the respective electrical connector to be moved axially within the respective connector holder.

17. A solar module electrical connector holder, comprising:
a body portion;
a first resilient wing portion attached to the body portion;
a second resilient wing portion attached to the body portion;

wherein the first and second resilient wing portions mate with a first connector window in a frame of a solar module and allow the position of an electrical connector to be moved one of vertically, horizontally and angularly with respect to the frame, and a first axial portion attached to the body portion and a second axial portion attached to the body portion wherein the first and second axial portions permits an electrical connector to be moved axially within the connector holder.

* * * * *